US009425187B1

(12) United States Patent
Titus

(10) Patent No.: US 9,425,187 B1
(45) Date of Patent: Aug. 23, 2016

(54) APPARATUS AND METHODS FOR MODULATING CURRENT / VOLTAGE RESPONSE USING MULTIPLE SEMI-CONDUCTIVE CHANNEL REGIONS (SCR) PRODUCED FROM DIFFERENT INTEGRATED SEMICONDUCTOR STRUCTURES

(71) Applicant: The United States of America as represented by the Secretary of the Navy, Washington, DC (US)

(72) Inventor: Jeffrey L. Titus, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/724,267

(22) Filed: May 28, 2015

Related U.S. Application Data

(63) Continuation-in-part of application No. 14/664,186, filed on Mar. 20, 2015.

(60) Provisional application No. 62/151,801, filed on Apr. 23, 2015, provisional application No. 62/116,129, filed on Feb. 13, 2015.

(51) Int. Cl.
| | | |
|---|---|---|
| H01L 27/02 | (2006.01) | |
| H01L 29/78 | (2006.01) | |
| H01L 29/808 | (2006.01) | |
| H01L 23/552 | (2006.01) | |
| H01L 31/02 | (2006.01) | |
| H01L 27/144 | (2006.01) | |

(52) U.S. Cl.
CPC .......... *H01L 27/0266* (2013.01); *H01L 23/552* (2013.01); *H01L 27/144* (2013.01); *H01L 29/7817* (2013.01); *H01L 29/808* (2013.01); *H01L 31/02016* (2013.01)

(58) Field of Classification Search
USPC .......................... 327/419, 427–429, 564–566; 438/137–138, 151, 155, 156, 212
See application file for complete search history.

(56) References Cited

U.S. PATENT DOCUMENTS

| | | | | |
|---|---|---|---|---|
| 4,811,065 | A | 3/1989 | Cogan | |
| 6,504,184 | B2 * | 1/2003 | Alok | ................... H01L 21/0445 257/151 |
| 6,828,605 | B2 * | 12/2004 | Eisele | ................. H01L 29/1045 257/213 |

(Continued)

OTHER PUBLICATIONS

Johnson, Palau, Dachs, Galloway, Schrimpf, A review of the Techniques Used for Modling Single-Event Effects in Power MOSFET's; IEEE Trans. Nucl. Sci., Apr. 1996, 546-560, vol. 43, No. 2 (15 total pages).
Titus, Wheatley, Experimental Studies of Single-Event Gate Rupture and Burnout in Vertical Power MOSFET's, IEEE Trans. Nucl. Sci., Apr. 1996, 533-545, vol. 43. No. 2 (13 total pages).

(Continued)

*Primary Examiner* — An Luu
(74) *Attorney, Agent, or Firm* — Christopher A. Monsey

(57) ABSTRACT

Apparatuses and methods for modulating current/voltage response using multiple semi-conductive channel regions (SCR) produced from different integrated semiconductor structures are provided. In particular, embodiments include systems and methods for controlling current or mitigating electromagnetic or radiation interference effects using combined integrated functions of a lateral double-diffused metal-oxide semiconductor field effect transistor (LDMOSFET) and junction field effect transistor (JFET) disposed in proximity of a LDMOSFET's SCR within a certain orientation forming a second SCR.

31 Claims, 35 Drawing Sheets

(56) References Cited

U.S. PATENT DOCUMENTS

| | | |
|---|---|---|
| 7,843,004 B2 | 11/2010 | Darwish |
| 8,963,218 B2 * | 2/2015 | Sobti ................. H01L 29/42368 257/263 |
| 2015/0295571 A1 | 10/2015 | Cole et al. |

OTHER PUBLICATIONS

Titus, An Updated Perspective of Single Event Gate Rupture and Single Event Burnout in Power MOSFET's, IEEE Trans. Nucl. Sci., Jun. 2013, 1912-1928, vol. 60, No. 3 (17 total pages).

* cited by examiner

N-Channel LDMOSFET

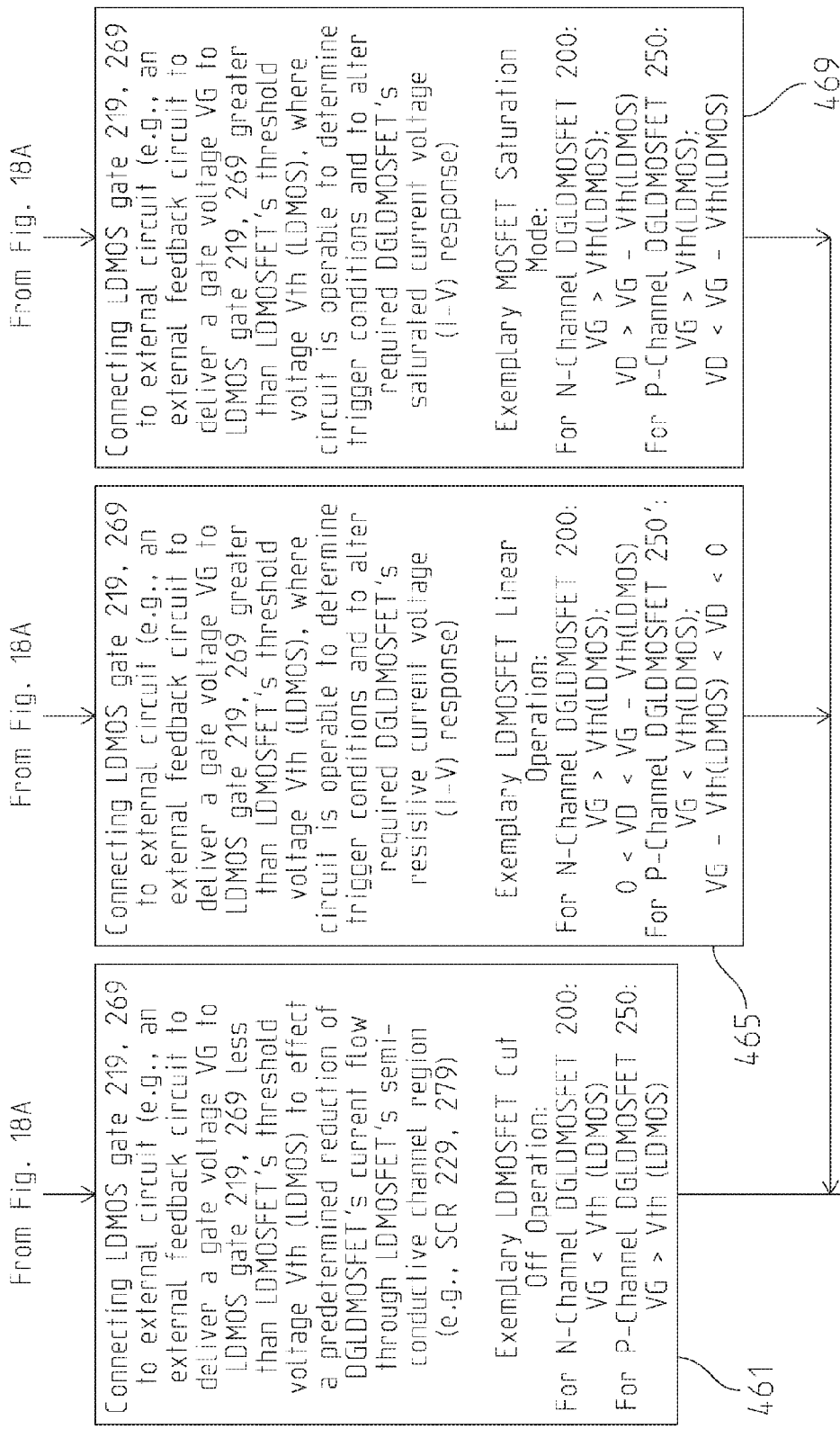

From Fig. 20A →

565 — Connecting LDMOS gate 219, 269 to external circuit (e.g., connecting an external feedback circuit to deliver a gate voltage VG to LDMOS gate 219, 269 to drive DGLDMOSFET's I-V response to transition between cut-off operation (Fig. 18 step 461) and Linear operation (Fig. 18 step 465) to effect a predetermined DGLDMOSFET's (I-V) response operable to a duty cycle)

→ To Fig. 20C

From Fig. 20A →

561 — Connecting JFET gate 225, 275 to external circuit (e.g., an external feedback circuit to deliver a gate voltage VG to JFET gate 225, 275 that is greater than JFET's threshold voltage Vth(JFET), where circuit is operable to determine trigger conditions and to alter required DGLDMOSFET's resistive current-voltage (I-V) response)

Note: LDMOS Linear operation (Fig. 18 step 465) and JFET Linear operation can both be used to modulate DGLDMOSFET's resistive I-V response Exemplary JFET Linear Operation
For N-Channel DGLDMOSFET 200:
  VG > Vth(JFET);
  0 < VD < Vth(JFET) - VG
For P-Channel DGLDMOSFET 250:
  VG < Vth(JFET);
  Vth(JFET) - VG < VD < 0

From Fig. 21A →

615: Connecting LDMOS gate 219, 269 to external circuit (e.g., connecting an external feedback circuit to deliver a gate voltage VG to LDMOS gate 219, 269 to drive DGLDMOSFET's I-V response to transition between MOS cut-off operation (Fig. 18 step 461) and LDMOS saturation operation (Fig. 18 step 469) to effect a predetermined DGLDMOSFET's (I-V) response operable to a duty cycle)

→ To Fig. 21C

From Fig. 21A →

611: Connecting JFET gate 225, 275 to external circuit (e.g., an external feedback circuit to deliver a gate voltage VG to JFET gate 225, 275 that is greater than JFET's threshold voltage Vth(JFET), where circuit is operable to determine trigger conditions and to alter required DGLDMOSFET's saturation current-voltage (I-V) response)

Note: MOS saturation operation (Fig. 18 step 469) and JFET saturation operation can both be used to modulate DGLDMOSFET's saturation I-V response Exemplary JFET Saturation Operation
For N-Channel DGLDMOSFET 200:
VG > Vth(JFET);
VD > Vth(JFET) - VG
For P-Channel DGLDMOSFET 250:
VG < Vth(JFET);
VD < Vth(JFET) - VG → To Fig. 21C

APPARATUS AND METHODS FOR MODULATING CURRENT / VOLTAGE RESPONSE USING MULTIPLE SEMI-CONDUCTIVE CHANNEL REGIONS (SCR) PRODUCED FROM DIFFERENT INTEGRATED SEMICONDUCTOR STRUCTURES

CROSS-REFERENCE TO RELATED APPLICATIONS

The present application claims priority to U.S. Provisional Patent Application Ser. No. 62/151,801, filed Apr. 23, 2015, entitled "COMBINED INTEGRATED FUNCTIONS OF LATERAL DOUBLE-DIFFUSED METAL-OXIDE-SEMI-CONDUCTOR FIELD-EFFECT TRANSISTOR (LDMOS-FET) AND JUNCTION-FIELD-EFFECT TRANSISTOR (JFET) OPERABLE FOR MODULATING CURRENT/ VOLTAGE RESPONSE OR MITIGATING ELECTRO-MAGNETIC OR RADIATION INTERFERENCE EFFECTS BY ALTERING CURRENT FLOW EITHER THROUGH LDMOSFET'S SEMI-CONDUCTIVE CHANNEL REGION (SCR), THROUGH JFET'S SCR, OR THROUGH BOTH SCRS," and is a continuation-in-part to U.S. patent application Ser. No. 14/664,186, filed Mar. 20, 2015, entitled "CONTROLLING CURRENT OR MITIGATING ELECTROMAGNETIC OR RADIATION INTERFERENCE EFFECTS USING MULTIPLE AND DIFFERENT SEMI-CONDUCTIVE CHANNEL REGIONS GENERATING STRUCTURES," which claims priority to U.S. Provisional Patent Application Ser. No. 62/116,129, filed Feb. 13, 2015 entitled "SYSTEMS AND METHODS FOR CONTROLLING CURRENT OR MITIGATING ELECTROMAGNETIC OR RADIATION INTERFER-ENCE EFFECTS USING MULTIPLE AND DIFFERENT SEMI-CONDUCTIVE CHANNEL REGIONS GENERATING STRUCTURES FORMED BY MULTIPLE DIFFERENT SEMI-CONDUCTIVE ELECTRICAL CURRENT OR VOLTAGE CONTROL STRUCTURES," the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,228) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

This invention generally relates to apparatuses and methods for modulating current/voltage response using multiple different semiconductor structures which create different SCR operable to influence an electrical signal path in different environments or modes. In particular, embodiments of the invention can have various implementations using different types of semiconductor structures which can be used, e.g., for implementing or using types of semiconductors that, by themselves, are normally susceptible to various types of radiation or electromagnetic interference effects. Embodiments of the invention provide various approaches to enable use of such semiconductor structures in various applications or environments including a radiation or electromagnetic interference environment.

Lateral Double-Diffused Metal-Oxide-Semiconductor Field-Effect Transistors (LDMOSFETs) are used because of their fast switching, high power capabilities. FIG. 1 represents a simplistic vertical cross-sectional view of an exemplary N-channel LDMOSFET 1 design/layout where a LDMOSFET structure is sliced parallel to a source and a drain and laterally along a channel (for reference, see FIG. 2, orientation of cutline AB used in FIG. 1). An exemplary N-channel LDMOSFET 1 as shown in FIG. 1 uses a first and second surface of a P substrate 101 (e.g., P doped silicon). On first surface, a conductive layer (e.g., metal) is disposed onto P substrate forming a substrate contact 117. On second surface (e.g., opposite surface of substrate contact 117), an N epitaxial layer 103 (e.g., N doped silicon) is disposed onto P substrate 101. On opposing surface of N-epitaxial layer 103 as P substrate 101, a region of opposite doping (N epitaxial layer uses P doping) is implanted/diffused to form P-body 105 (e.g., P body for source). To ensure Ohmic, e.g., resistive or electrical, contact to P body region, a higher P+ doped region is implanted/diffused into surface of P body region to form P+ body 111 (e.g., a body well contact region). After P doped regions (P body 105 and P+ body 111) are formed, an opposite doping of exemplary P body regions (e.g., N doping) is implanted/diffused into surface of P body 105 and adjacent to P+ body 111 forming an N+ body 109 region defining a source region and another N+ body is implanted/diffused into surface of N epitaxial layer 103 on opposing side of P substrate 101 forming an N+ body 107 defining a drain region where placement of N+ body is at a defined separation distance between P body 105 region and N+ body region (separation distance defines LDMOSFET's breakdown voltage). A gate dielectric 113 is disposed on top of and overlapping a portion of N+ body 109 extending laterally over P body 105 and overlapping a portion of N epitaxial layer 103. A conductive layer (e.g., polysilicon) is disposed on top of gate dielectric 113 to form a gate contact 115 (e.g., LDMOS gate contact). A region extending from N+ body across P body 105 to N epitaxial layer 103 underneath gate dielectric 113 defines a semi-conductive channel region (SCR) 123. Dashed arrow lines 125 represent an electrical current path that is formed during operation of exemplary N-channel LDMOSFET 1. Another conductive layer (e.g., metal) is disposed on top and overlapping a portion of P+ body 111 extending laterally over and covering a portion of N+ body 109 to form a source contact 121 (e.g., a LDMOS source contact). Another conductive layer (e.g., metal) is disposed on top of and covering a portion of N+ body 107 to form a drain contact 119 (e.g., LDMOS drain contact). Those steps provide a simplistic description of how an N-channel LDMOSFET 1 can be manufactured. P-channel LDMOSFETs (not shown) can be manufactured following similar steps but differs in design to an N-channel LDMOSFET 1 in that references to N doped regions (e.g., N epitaxial layer and N+ body) become P doped regions (e.g., P epitaxial layer and P+ body) and references to P doped regions (e.g., P substrate, P body and P+ body) become N doped regions (e.g., N substrate, N body, and N+ body).

Attempts have been made, including numerous modifications/improvements in design, layout, and fabrication of LDMOSFETs, to enhance electrical and radiation performance (e.g., increase power density, faster switching, enhanced radiation performance, etc.). Significant efforts have been devoted to resolve certain radiation issues (e.g., total ionizing dose (TID), single-event burnout (SEB); and single-event gate rupture (SEGR)).

Under some types of LDMOSFET operation, application of an appropriate gate voltage (a gate voltage greater than LDMOSFET's gate threshold voltage) forms a semi-conductive channel region between source and drain (an electrical conductive path) allowing current to flow (LDMOSFET is turned on). Higher gate voltages above threshold voltage equate to higher current flow. One effect of TID is to trap charge within gate dielectric, which in turn induces a shift in LDMOSFET gate threshold voltage (e.g., gate threshold voltage changes with TID). If TID-induced threshold voltage shifts become sufficiently large, LDMOSFETs can become non-functional (e.g., N-channel LDMOSFETs cannot be turned off and P-channel LDMOSFETs cannot be turned on without exceeding electrical specifications). Methods have been attempted to help resolve TID issues in LDMOSFETs. One method seeks to decrease gate dielectric thickness (e.g., thinner gate dielectric traps less charge but makes device more susceptible to SEGR). Another method entails controlling quality of gate dielectric (e.g., higher gate dielectric quality traps less charge) but higher quality also equates to higher costs. Another method entails exceeding gate voltage specifications to drive LDMOSFET (e.g., to turn-on or turn-off device) but applied voltages can rapidly exceed a safe operating range and higher voltages make devices more susceptible to SEGR.

FIG. 3 represents a cross-sectional view of a simplistic design/layout of an exemplary N-channel Junction-Field-Effect Transistor (JFET) 3 where JFET structure is cut perpendicular to a drain contact 141 and a source contact 143 along the JFET gates 137, 139. JFETs use a reverse-biased PN junction to control current flow by modulating a depletion field (e.g., depletion field lines 147) within a semi-conductive channel region (SCR) 145 (e.g., a higher reverse voltage extends depletion field outward restricting current flow in SCR 145). N-Channel JFETs use N Substrate 131 (e.g., N doped substrate). A conductive layer (e.g., metal) is disposed onto opposite sides of N substrate 131 forming a drain contact 141 on one side and a source contact 143 on the other side. A region of opposite doping of N substrate 131 is implanted/diffused in between drain and source in proximity to substrate middle forming two P body regions 133, 135, where P-body region in conjunction with the N substrate forms a PN junction. A conductive layer (e.g., metal) is disposed onto each P-body region forming JFET gate contacts 137, 139. P-channel JFETs (not shown) can be manufactured following similar steps but differs in design to an N-channel JFET 3 in that references to N doped regions (e.g., N epitaxial layer) become P doped regions (e.g., P epitaxial layer) and references to P doped regions (e.g., P body) become N doped regions (e.g., N body).

JFETs exhibit a natural hardness to TID effects; whereas TID effects in LDMOSFETs are caused by trapped charge in gate dielectric which in turn interferes with modulation of semi-conductive channel region. JFETs employ a depletion field to modulate a semi-conductive channel region and are not affected by trapped charge.

LDMOSFET transistors subjected to space-like environments or other particle-enriched environments are prone to SEGR and SEB, which can adversely affect a device's performance and can even cause catastrophic system failure. When a charge particle traverses a material, it sheds energy in accordance with its linear energy transfer (LET) function for that material and that energy can create electron-hole pairs along its path. In presence of an electric field, these electron-hole pairs can separate producing unwanted current flow. A resultant current flow under certain conditions can lead to SEB or SEGR. SEB can occur if particle-induced current flow turns on a parasitic bipolar transistor (parasitic bipolar is inherent to design of device) and can lead to thermal runaway (e.g., device fails catastrophically). SEGR can occur if particle-induced current flow disrupts the depletion field in the epitaxial layer under the gate coupling a portion of drain potential across gate dielectric sufficient to damage gate dielectric. SEB and SEGR mechanisms can be more complex than presented here but intent is to provide a cursory explanation of SEGR.

To address these and other disadvantages, embodiments of the invention are provided that include apparatuses and methods for modulating current/voltage response using multiple SCRs produced from different integrated semiconductor structures. For example, exemplary embodiments of the invention provide a structure offering operational performance to address various disadvantages associated with currently available transistors and provide desired improvements. In general, an embodiment of the invention includes an integrated combination of LDMOSFET and JFET functions operable to modulate current/voltage response or to mitigate electromagnetic or radiation interferences by altering current flow through either a LDMOSFET's semi-conductive channel region (SCR), through a JFET's SCR, or through both. For example, one embodiment of the invention, such as an exemplary Dual-Gate Lateral Diffused Metal-Oxide-Semiconductor Field Effect Transistor (DGLDMOSFET), can include a layout/design of an innovative dual gate structure integrating/combining structures of both, a LDMOSFET and a JFET transistor, allowing a drain-to-source current to be controlled by either a LDMOSFET gate, by a JFET gate, or by both. An exemplary DGLDMOSFET can be fabricated as a monolithic device integrating functions of a LDMOSFET transistor with functions of a JFET transistor into a monolithic structure providing characteristics that are unique in operation and performance to either transistor function.

Exemplary embodiments of the invention, e.g., DGLDMOSFET, can also enhance operational performance in a radiation environment (e.g., radiation environments prone to TID, SEB, and SEGR). An exemplary embodiment with an integrated JFET gate function can provide a radiation-hardened-by-design (RHBD) where an integrated JFET control gate continues to control a drain-to-source current flow beyond operational failure of an LDMOSFET control gate (e.g., JFET control gate can continue to control current in semi-conductive channel region if LDMOSFET control gate becomes non-functional (e.g., from TID-induced threshold voltage shifts)). An exemplary DGLDMOSFET can provide an enhanced barrier (e.g., JFET's depletion field region) that can limit a radiation particle's interaction with exemplary embodiments of the invention from suffering from SEB and SEGR conditions. An exemplary DGLDMOSFET can be useful in RF type applications such as mixers, gain control, amplifiers, and detectors because the exemplary device employs a second independent gate to control current flow in the semi-conductive channel region.

Radio-frequency (RF) applications such as RF mixers, RF amplifiers, RF gain control, and RF detectors can employ two individual transistors or can use a dual gate transistor in its circuit design. FIG. 4 shows two exemplary RF circuits where one design uses a dual gate transistor 161 and another uses two transistors 163. Circuits using two transistors instead of a dual gate transistor are less desirable due to added costs, weight and area.

Additional features and advantages of the present invention will become apparent to those skilled in the art upon consideration of the following detailed description of illustrative embodiment(s) exemplifying some best modes of carrying out the invention as presently perceived.

BRIEF DESCRIPTION OF THE DRAWINGS

The detailed description of the drawings particularly refers to the accompanying figures in which:

FIGS. 18A, 18B and 18C show an exemplary method of operation of an exemplary embodiment of the invention comprising another mode of operation;

FIGS. 20A, 20B and 20C show an exemplary method of operation of an exemplary embodiment of the invention comprising another mode of operation;

FIGS. 21A, 21B and 21C show an exemplary method of operation of an exemplary embodiment of the invention comprising another mode of operation;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
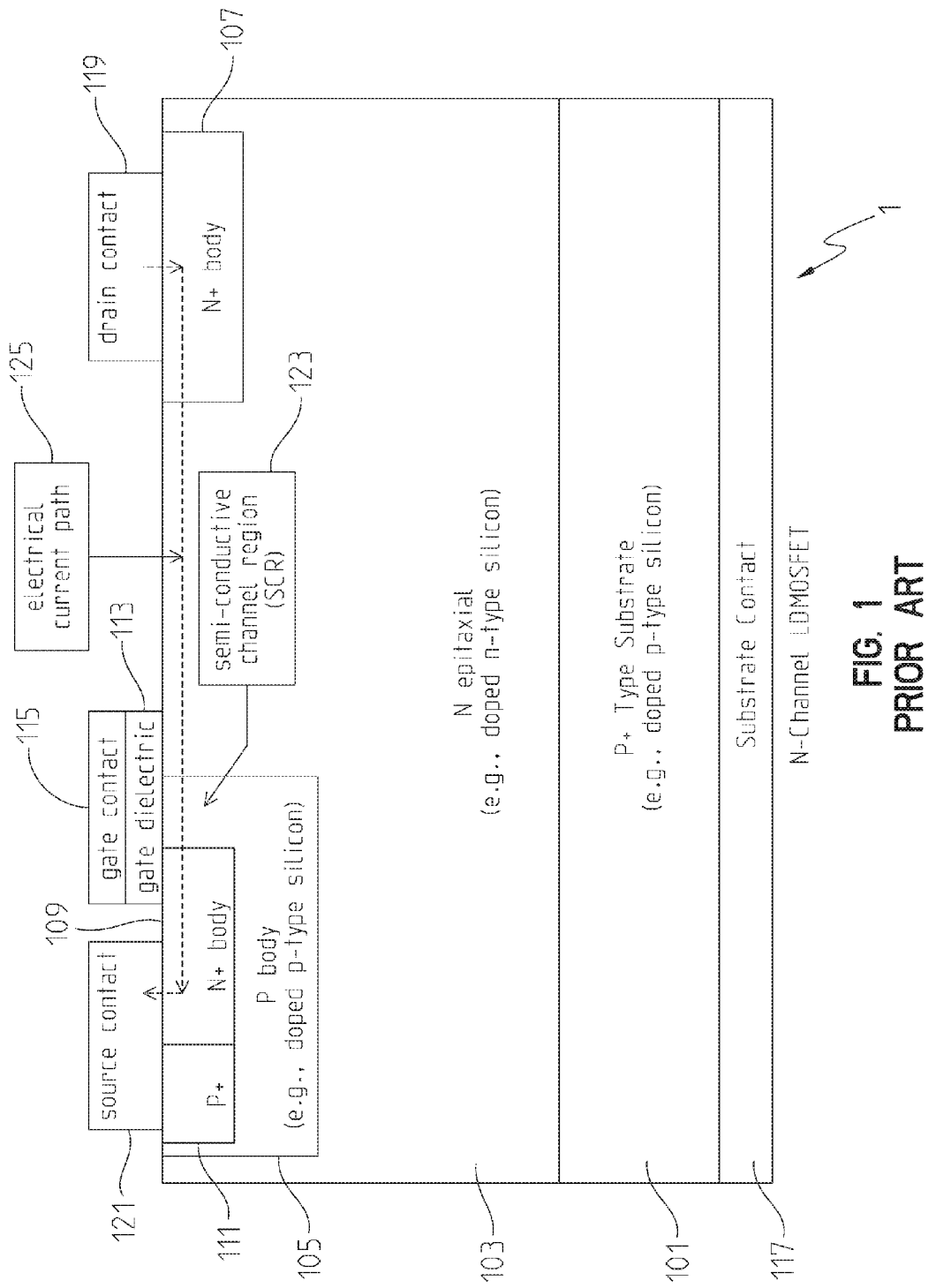
FIG. 1 shows a simplified cross-sectional view of a N-channel LDMOSFET.
Figure 2:
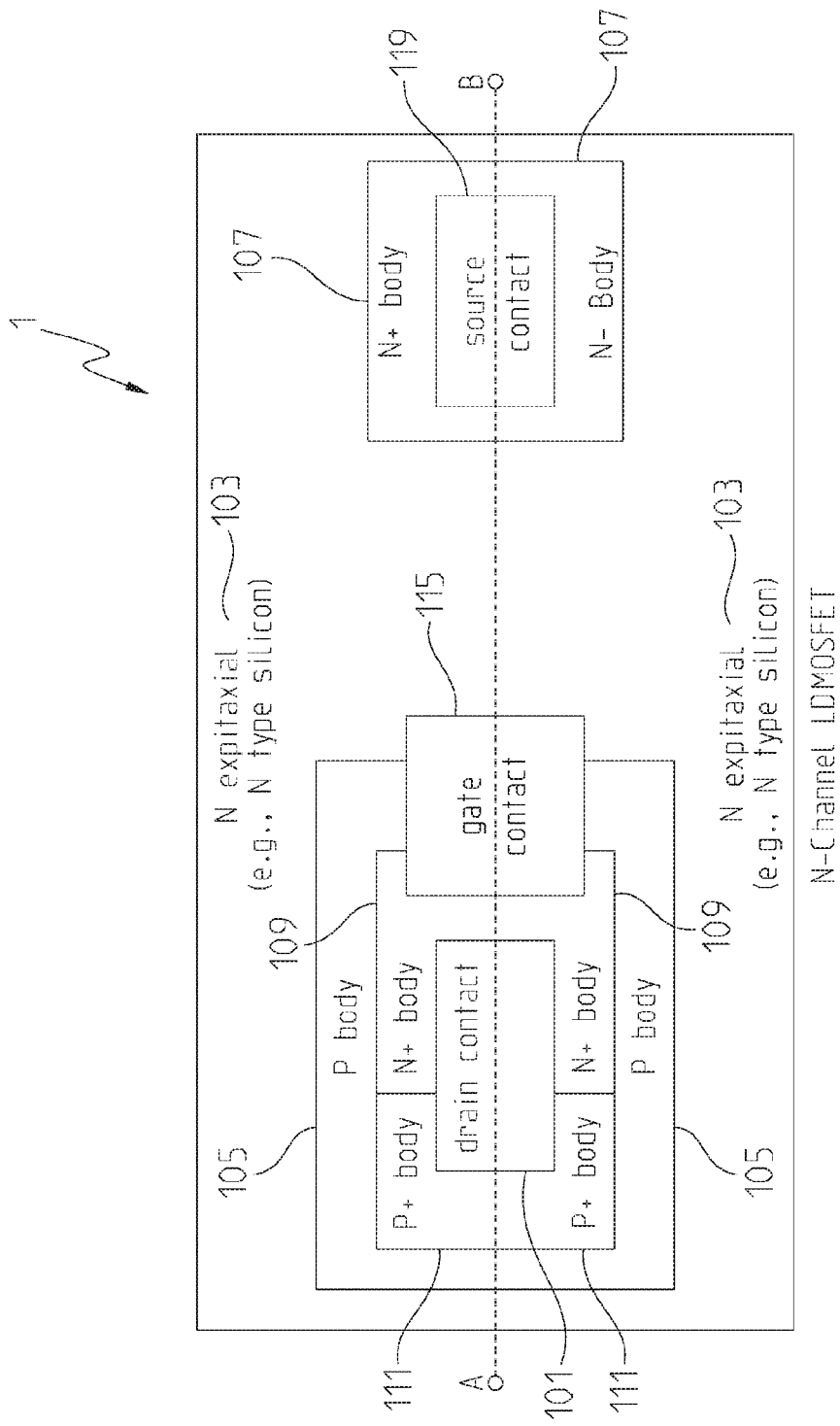
FIG. 2 shows a simplified top view of a N-channel LDMOSFET.
Figure 3:
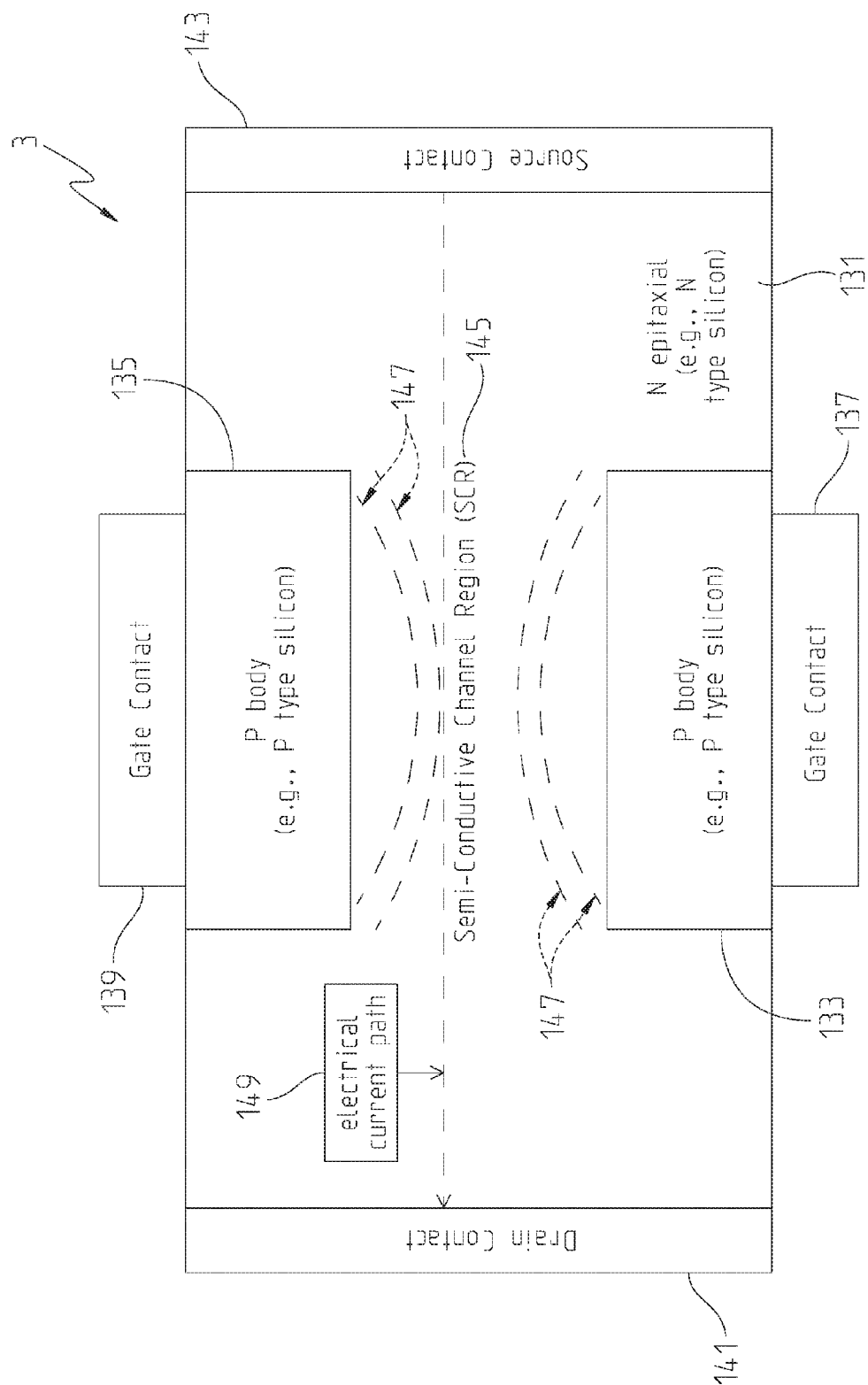
FIG. 3 shows a simplified cross-sectional view of a N-channel JFET.
Figure 4:
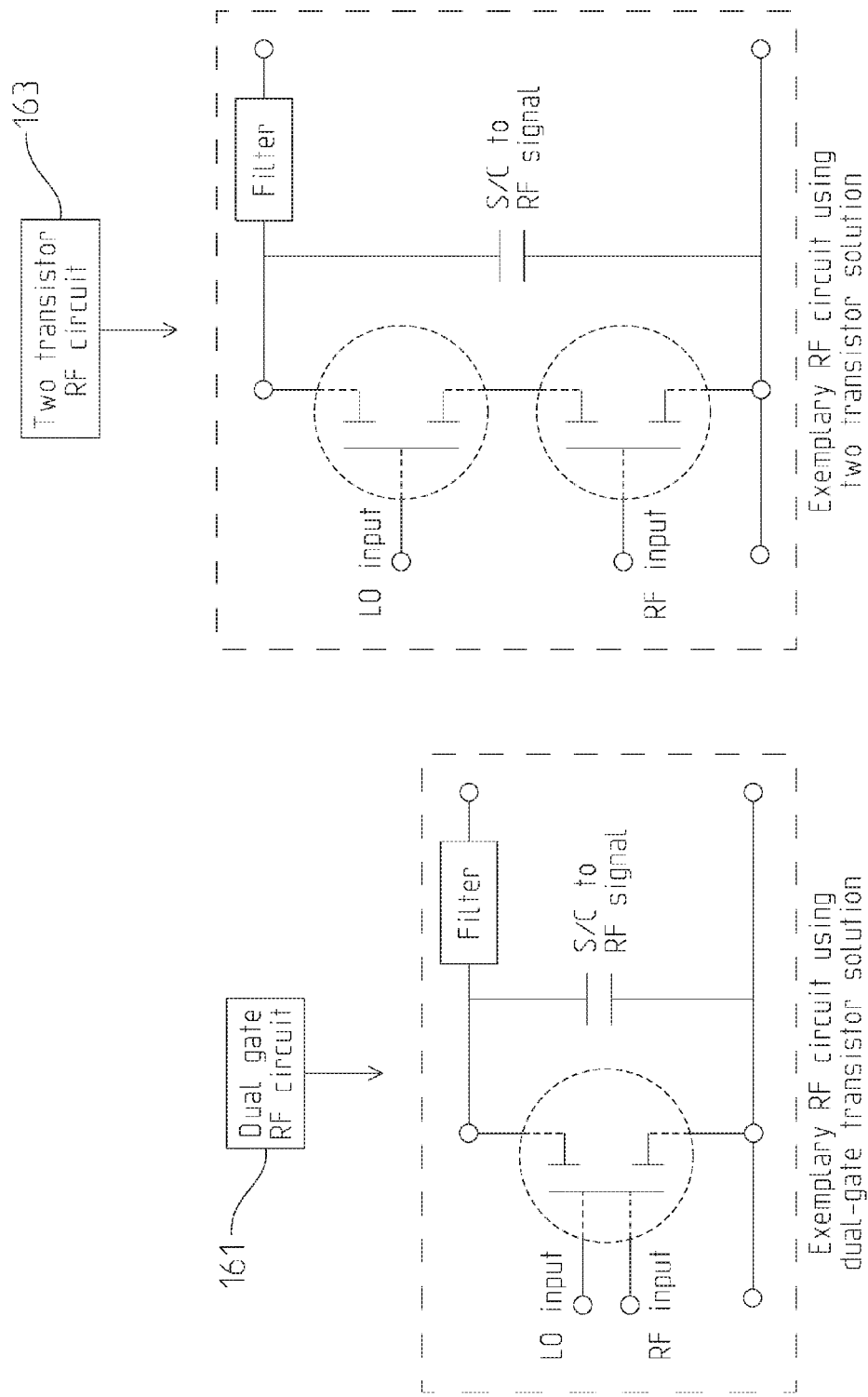
FIG. 4 shows a simplified RF application using a dual-gate transistor solution and another using a two transistor solution.
Figure 5:
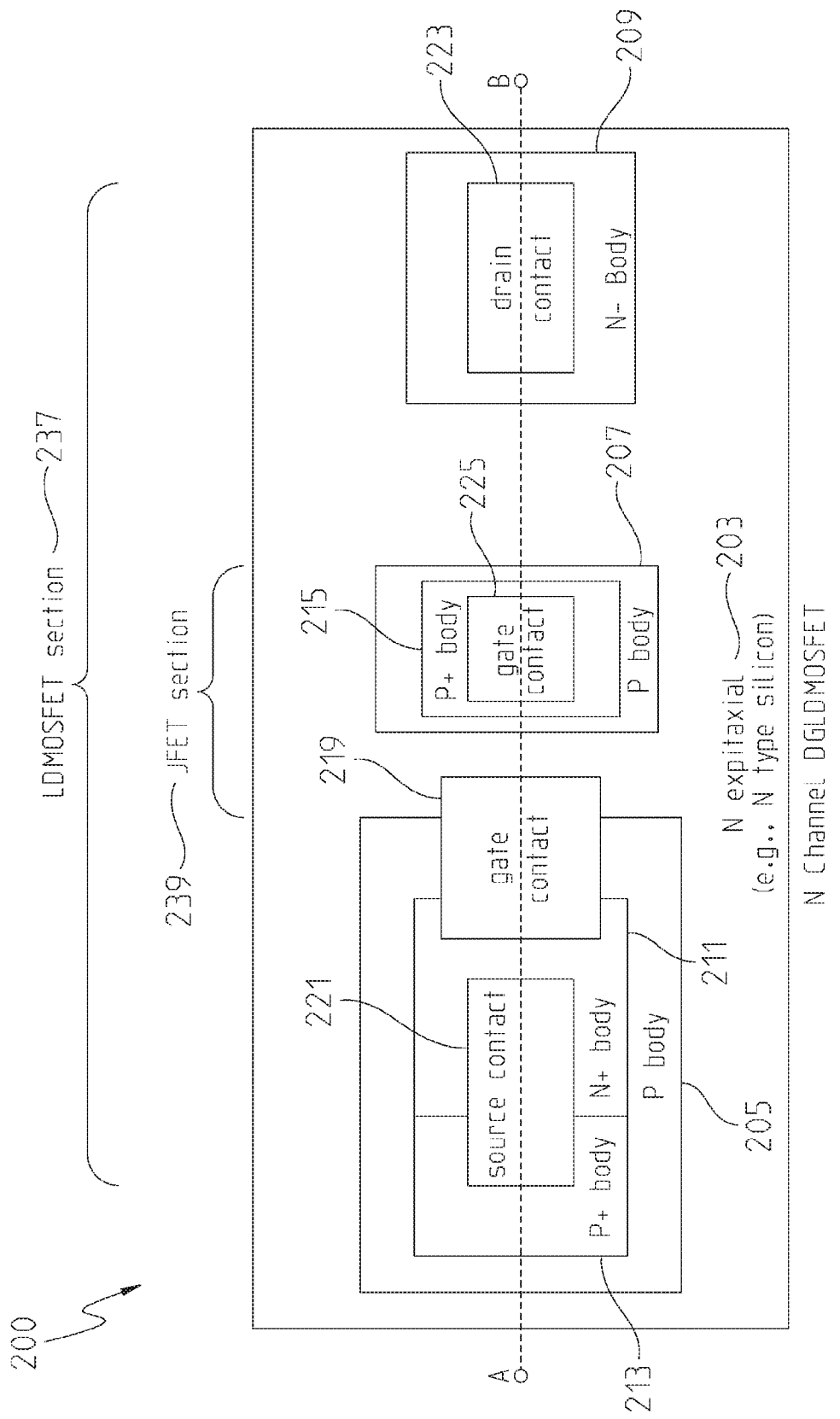
FIG. 5 shows a simplified cross-sectional top view of an exemplary N-channel DGLDMOSFET in accordance with one embodiment of the invention.

FIG. 5 depicts a top-view of exemplary N-channel DGLDMOSFETs 200 showing a LDMOSFET section 237 comprising a P body 205 disposed within an N epitaxial layer 203; an N+ body 211 region and a P+ body 213 region disposed within P body 205 region; a source contact 221 disposed onto and covering a portion of N+ body 211 and P+ body 213; a gate contact 219 disposed onto and covering a gate dielectric (not shown in this figure) overlapping a portion of N+ body 211 extending over a portion of P body 205 and overlapping a portion of N epitaxial 203; an N+ body 209 region disposed within an N epitaxial 203 placed on an opposite side to P-body 205 and a drain contact 223 disposed onto and covering a portion of N+ body 209; and showing a JFET section 239 comprising a portion of P body 205 in proximity to a P-body 207 disposed within N-epitaxial 203; a P+ body 215 disposed within P-body 207; and a gate contact 225 disposed onto and covering a portion of P+ body 215. LDMOSFET section 237 and JFET section 239 are disposed within an N substrate 203. In this exemplary embodiment, JFET structure 239 is disposed within N substrate 203 such that when JFET is operated, a depletion field (not shown) can decouple a semi-conductive channel region (region located between and in proximity to P body 205 and P body 207) before extending to opposing side of N epitaxial 203. Placement of P body 207 to P body 205 (separation distance) is one parameter to define the operational gate voltage required to prevent current flow.

Figure 6:
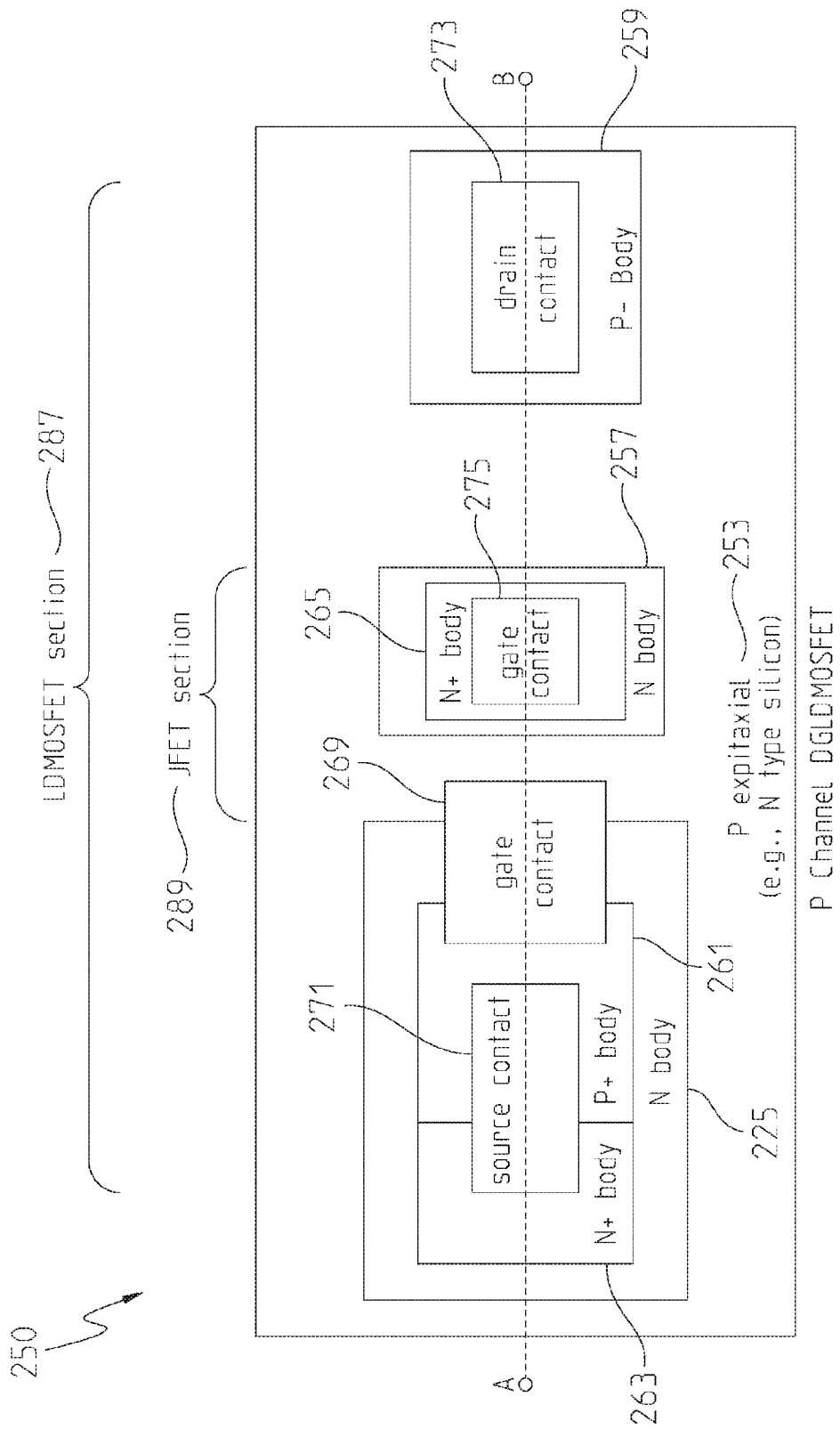
FIG. 6 shows a simplified cross-sectional top view of an exemplary P-channel DGLDMOSFET in accordance with one embodiment of the invention.

FIG. 6 depicts a top-view of exemplary P-channel DGLDMOSFETs 250 showing a LDMOSFET section 287 comprising a N body 255 disposed within an P epitaxial layer 253; a P+ body 261 region and an N+ body 263 region disposed within N body 255 region; a source contact 271 disposed onto and covering a portion of P+ body 261 and N+ body 263; a gate contact 269 disposed onto and covering a gate dielectric (not shown in this figure) overlapping a portion of P+ body 261 extending over a portion of N body 255 and overlapping a portion of P epitaxial 253; an P+ body 259 region disposed within an P epitaxial 253 placed on an opposite side to N-body 255 and a drain contact 273 disposed onto and covering a portion of P+ body 259; and showing a JFET section 289 comprising a portion of N body 255 in proximity to an N-body 257 disposed within P-epitaxial 253; an N+ body 265 disposed within N body 257; and a gate contact 275 disposed onto and covering a portion of N+ body 265. An exemplary DGLDMOSFET design/layout can be fabricated using common schemes (e.g., stripe, rectangular, or hexagonal cell) and can be replicated/placed in parallel to provide different operational capabilities (e.g., current) depending upon number of replicated cells.

Figure 7:
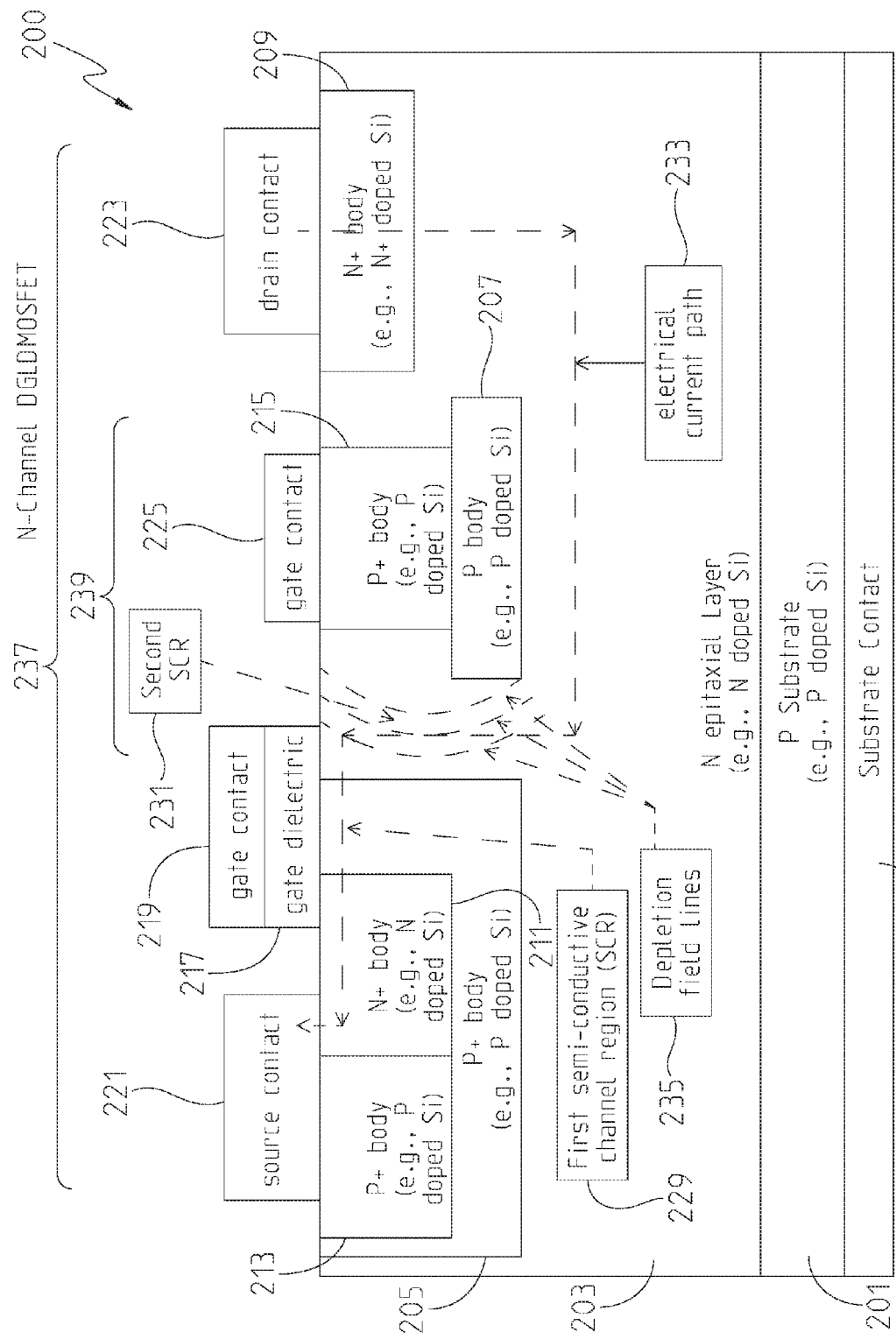
FIG. 7 shows a simplified cross-sectional side view of an exemplary N-channel DGLDMOSFET in accordance with one embodiment of the invention.

FIG. 7 represents a simplistic vertical cross-sectional view of an exemplary N-channel DGLDMOSFET 200 design/layout where an exemplary DGLDMOSFET structure is sliced parallel to a source and a drain along the length of a channel (for reference, see orientation of cutline AB in FIG. 5). An exemplary N-channel DGLDMOSFET 1 uses a first and second surface of a P substrate 201 (e.g., P doped silicon). Note that an insulated substrate can be substituted in place of a doped substrate. On first surface, a conductive layer (e.g., metal) is disposed onto P substrate forming a substrate contact 227. On second surface of substrate (e.g., opposite surface of substrate contact 227), an N epitaxial layer 203 (e.g., N doped silicon) is disposed onto P substrate 201. On opposing surface of N-epitaxial layer 203 as P substrate 201, a region of opposite doping (N epitaxial layer uses P doping) is implanted/diffused to form a P-body 205 region (e.g., P body for source). On opposing surface of N-epitaxial layer 203 as P substrate 201, another P body region is implanted/diffused forming a P-body region 207 in close proximity to P-body region 205 where a region in between P body region 205 and P body region 207 define a JFET semi-conductive channel region 231 (doping concentration of regions and separation distance defines JFET's gate threshold voltage Vth (JFET)). Dashed gray lines 235 are shown exemplifying production of a depletion field created by operation of JFET SCR 231 when N epitaxial layer 203 and P-body 207 junction is reverse biased with a voltage (e.g., electrical power supply). To ensure Ohmic contacts of P body regions 205 and 207, higher P+ doped regions are implanted/diffused into surface of P body region 205 and 207 forming P+ body region 213 region and P+ body region 215. After P doped regions (P body regions 205 and 207 and P+ body regions 213 and 215) are formed, a region of opposite doping of P body regions (e.g., N doping) is implanted/diffused into surface of P body region 205 adjacent to P+ body region 213 forming an N+ body region 211 (defining a source region) and another N+ body region is implanted/diffused into surface of N epitaxial layer 203 on opposing surface of P substrate 201 forming an N+ body region 209 (defining a drain region) where N+ body region 209 is placed at a lateral distance from P body 207 region on an opposite side of P body 205 (separation distance between N+ body region 209 and P-body 207 defines one breakdown voltage capability of exemplary DGLDMOSFET). A gate dielectric 217 (e.g., silicon dioxide) is disposed on top of and overlapping a portion of N+ body region 211 extending laterally over P body region 205 and overlapping a portion of N epitaxial layer 203. A conductive layer (e.g., polysilicon) is disposed on top of gate dielectric 217 to form a gate contact 219 (e.g., LDMOSFET gate contact). An area extending laterally from N+ body region 211 across P body region 205 to N epitaxial layer 203 located underneath and in close proximity to gate dielectric 217 defines a semi-conductive channel region (SCR) 229. Dashed arrow lines 233 represent an electrical current path that is formed during operation of exemplary N-channel DGLDMOSFET 200. Another conductive layer (e.g., metal) is disposed on top and overlapping a portion of P+ body region 213 extending laterally over and covering a portion of N+ body region 211 forming a source contact 221 (e.g., DGLDMOSFET source contact). Another conductive layer (e.g., metal) is disposed on top of and covering a portion of N+ body region 209 forming a drain contact 223 (e.g., DGLDMOSFET drain contact).

Figure 8:
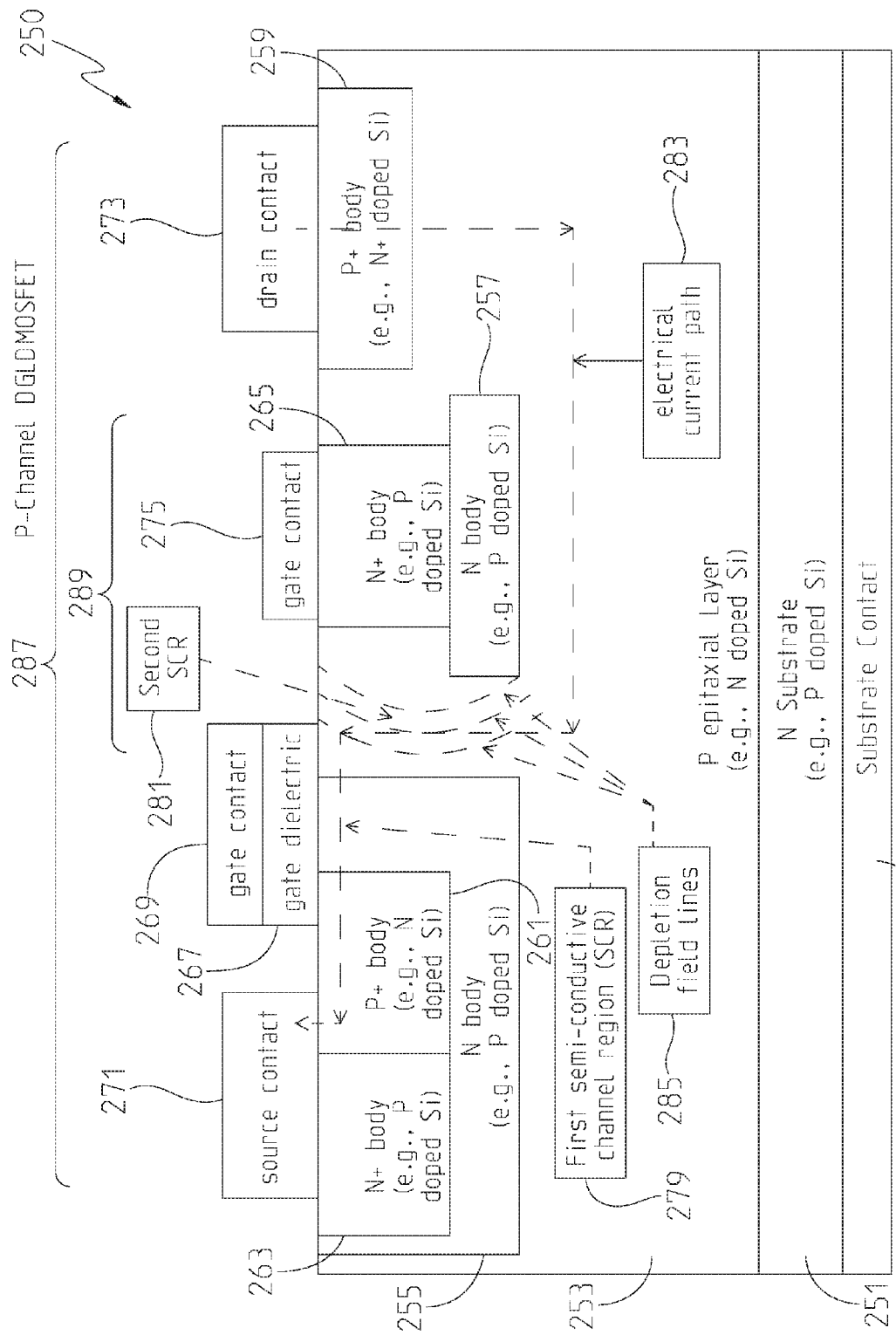
FIG. 8 shows a simplified cross-sectional side view of an exemplary P-channel DGLDMOSFET in accordance with one embodiment of the invention.

FIG. 8 represents a simplistic vertical cross-sectional view of an exemplary P-channel DGLDMOSFET 250 design/layout where an exemplary DGLDMOSFET structure is sliced parallel to a source and a drain along the length of a channel (for reference, see orientation of cutline AB in FIG. 6). An exemplary P-channel DGLDMOSFET 1 uses a first and second surface of a N substrate 251 (e.g., N doped silicon). On first surface, a conductive layer (e.g., metal) is disposed onto N substrate forming a substrate contact 277. On second surface of substrate (e.g., opposite surface of substrate contact 277), a P epitaxial layer 253 (e.g., P doped silicon) is disposed onto N substrate 251. On opposing surface of P-epitaxial layer 253 as N substrate 251, a region of opposite doping (P epitaxial layer uses N doping) is implanted/diffused to form a N-body 255 region (e.g., N body for source). On opposing surface of P-epitaxial layer 253 as N substrate 251, another N body region is implanted/diffused forming a N-body region 257 in close proximity to N-body region 255 where a region in between N body region 255 and N body region 257 define a JFET semi-conductive channel region 281 (doping concentration of regions and separation distance defines JFET's gate threshold voltage Vth (JFET)). Dashed gray lines 285 are shown exemplifying production of a depletion field created by operation of JFET SCR 281 when P epitaxial layer 253 and N-body 257 junction is reverse biased with a voltage (e.g., electrical power supply). To ensure Ohmic contact of N body regions 255 and 257, higher N+ doped regions are implanted/diffused into surface of N body region 255 and 257 forming N+ body region 263 region and N+ body region 265. After N doped regions (N body regions 255 and 257 and N+ body regions 263 and 265) are formed, a region of opposite doping of N body regions (e.g., P doping) is implanted/diffused into surface of N body region 255 adjacent to N+ body region 263 forming a P+ body region 261 (defining a source region) and another P+ body region is implanted/diffused into surface of P epitaxial layer 253 on opposing surface of N substrate 251 forming a P+ body region 259 (defining a drain region) where P+ body region 259 is placed at a lateral distance from N body 257 region on an opposite side of N body 255 (separation distance between P+ body region 259 and N body 257 defines one breakdown voltage capability of exemplary DGLDMOSFET). A gate dielectric 267 (e.g., silicon dioxide) is disposed on top of and overlapping a portion of P+ body region 261 extending laterally over N body region 255 and overlapping a portion of P epitaxial layer 253. A conductive layer (e.g., polysilicon) is disposed on top of gate dielectric 269 forming a gate contact 269 (e.g., LDMOSFET gate contact). An area extending laterally from P+ body region 261 across N body region 255 to P epitaxial layer 253 located underneath and in close proximity to gate dielectric 267 defining a semi-conductive channel region (SCR) 279. Dashed arrow lines 283 represent an electrical current path that is formed during operation of exemplary P-channel DGLDMOSFET 250. Another conductive layer (e.g., metal) is disposed on top and overlapping a portion of N+ body region 263 extending laterally over and covering a portion of P+ body region 261 forming a source contact 271 (e.g., DGLDMOSFET source contact). Another conductive layer (e.g., metal) is disposed on top of and covering a portion of P+ body region 259 forming a drain contact 273 (e.g., DGLDMOSFET drain contact). Those exemplary steps provide a simplistic design/layout description of a P-channel DGLDMOSFET 250.

Exemplary N-channel DGLDMOSFET 200 design/layout differs from exemplary P-channel DGLDMOSFET 250 design/layout in that references to N-Type become P-Type references and references to P-type become N-Type references. Element numbers used for elements in exemplary N-channel DGLDMOSFET design/layout are different from the element numbers used for elements in exemplary P-channel DGLDMOSFET design/layout. References to LDMOSFET structure and JFET structure are also different between exemplary N- and P-channel DGLDMOSFETs.

In above embodiments, two independent SCR 229 and 231 (for N-channel) or 279 and 281 (for P-channel) are formed as a result of design/layout shown in FIGS. 5-8. A first SCR is formed as part of LDMOSFET structure 237 (for N-channel) or 287 (for P-channel) underneath LDMOSFET gate dielectric 217 (for N-channel) or 267 (for P-channel) and a second SCR is formed as part of JFET structure 239 (for N-channel) or 289 (for P-channel) between P body regions 205 and 207 (for N-channel) and between N body regions 255 and 257 (for P-channel). SCR 237 (for N-channel) and 279 (for P-channel) regulate current flow through LDMOSFET structure 229 (for N-channel) and 279 (for P channel) where current flow is controlled by applying a voltage to LDMOSFET gate contact 219 (for N-channel) and 269 (for P-channel) while SCR 239 (for N-channel) and 281 (for P-channel) regulate current flow through JFET structure 239 (for N-channel) and 289 (for P-channel) by applying a voltage to JFET gate contact 225 (for N-channel) and 275 (for P-channel). An embodiment providing two independent gate functions is useful for mixing RF signals and providing enhanced radiation performance (e.g., LDMOSFET structure 237 (for N-channel) and 287 (for P-channel) are sensitive to radiation degradation that can be compensated for or eliminated by use of JFET structure 239 (for N-channel) and 289 (for P-channel)). Various negative radiation effects can be mitigated or eliminated by embodiments of this invention such as TID, SEB and SEGR.

An exemplary embodiment can include an exemplary control or sensor system that can be provided for (not shown) that can operate embodiments (e.g., FIGS. 5/7 or FIGS. 6/8) LDMOSFET structure 237 (or 287) and JFET structure 239 (or 289) in response to detected radiation fields or energy. For example, a control section can have a pulse width modulator (not shown) which would operate LDMOSFET structure 237 (or 287) and JFET structure 239 (or 289) in order to reduce or adjust radiation-induced currents or other aspects of operation of this system. A feedback circuit or look up table can be utilized by the control section (not shown) which can correlate operation of the LDMOSFET structure 237 (or 287) and JFET structure 239 (or 289) which in turn generates effects in SCR 231 (or 281) to increase radiation hardening or facilitate additional modulation schemes performed by an embodiment of the invention.

Conventional non-rad-hard LDMOSFETs cannot operate in a TID environment without degraded performance of LDMOSFET's semi-conductive channel region and may even become non-functional (non-functional performance can occur at TID below 10 krd(Si)). An exemplary JFET type gate is radiation tolerant (e.g., can exceed TID of 1 Mrd(Si)) and provides a method to control current flow if exemplary LDMOSFET control gate becomes degraded or nonfunctional due to TID radiation effects. An exemplary DGLDMOSFET offers similar electrical performance of a LDMOSFET but has an advantage of having two control gates to alter current flow through two independent semi-conductive channel regions.

One exemplary embodiment of the invention describes a design/layout of an innovative device, a DGLDMOSFET, providing gate control (a LDMOSFET control gate and a JFET control gate) of two independent semi-conductive channel regions integrated into a monolithic structure (integrated structure combines improved elements and functions of a LDMOSFET and a JFET providing unique functions). Exemplary DGLDMOSFET uses two independent gates to control current flow between exemplary drain and source making exemplary DGLDMOSFET suitable for RF type applications and providing enhanced TID performance. An embodiment includes an exemplary fabrication steps (design/layout) of an exemplary DGLDMOSFET. An exemplary DGLDMOSFET structure can be designed and fabricated to withstand voltages of a few volts to voltages that exceed hundred volts by employing different epitaxial layer (e.g., doping and thickness of epitaxial layer) and by employing different design spacing between elements 207 and 209 (for N-channel) and 257 and 259 (for P-channel). Current density of exemplary DGLDMOSFET structure can be altered by changing number of DGLDMOSFET cells that are replicated and placed in parallel. An exemplary DGLDMOSFET provides a monolithic solution reducing costs, size, and weight and increasing reliability.

An exemplary embodiment can be fabricated using silicon (Si) and silicon dioxide (SiO2) but other semiconductor materials such as silicon carbide (SiC) or gallium arsenide (GaAs) can be used instead of silicon (for substrate, epitaxial layer and doped regions) and other dielectric materials such as silicon nitride (SiN), aluminum oxide (Al2O3), and hafnium oxide (HfO2) can be used instead of SiO2 (for gate dielectric). Use of other semiconductor materials and gate dielectric materials will affect material properties (e.g., thermal conductivity, capacitance, carrier lifetime, etc.) yielding different electrical, thermal and performance characteristics.

Figure 9:
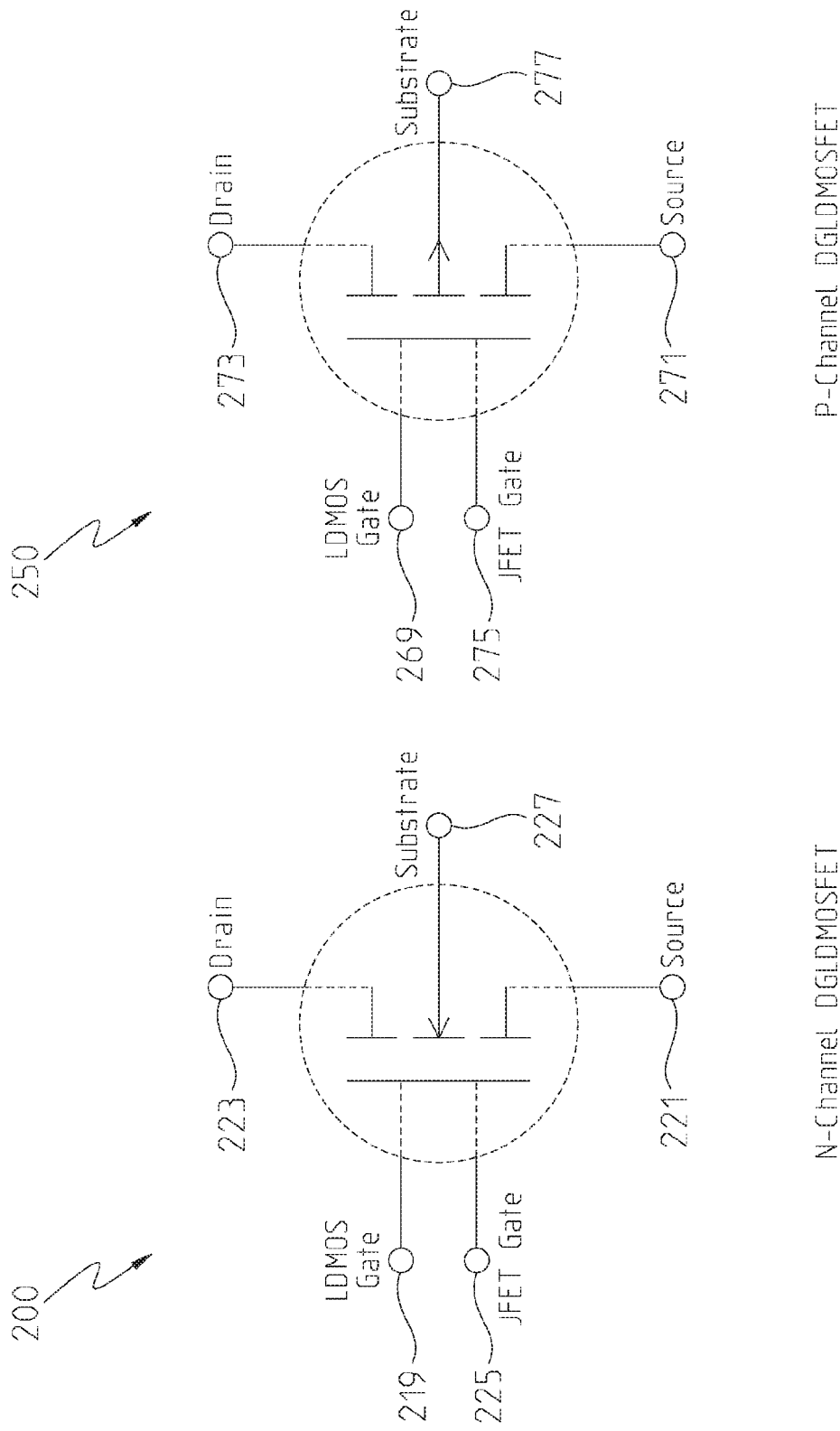
FIG. 9 shows an exemplary representation of applicable circuit symbols associated with exemplary DGLDMOSFET.

FIG. 9 shows a simplistic electrical representation of an exemplary N-channel DGLDMOSFET 200 and a P-channel DGLDMOSFET 250 in accordance with an embodiment of the invention, where electrical representation provides inputs and outputs such as drain 223, 273; source 221, 271; LDMOSFET control gate 219,269; JFET control gate 225, 275; and substrate 227, 277.

Figure 10:
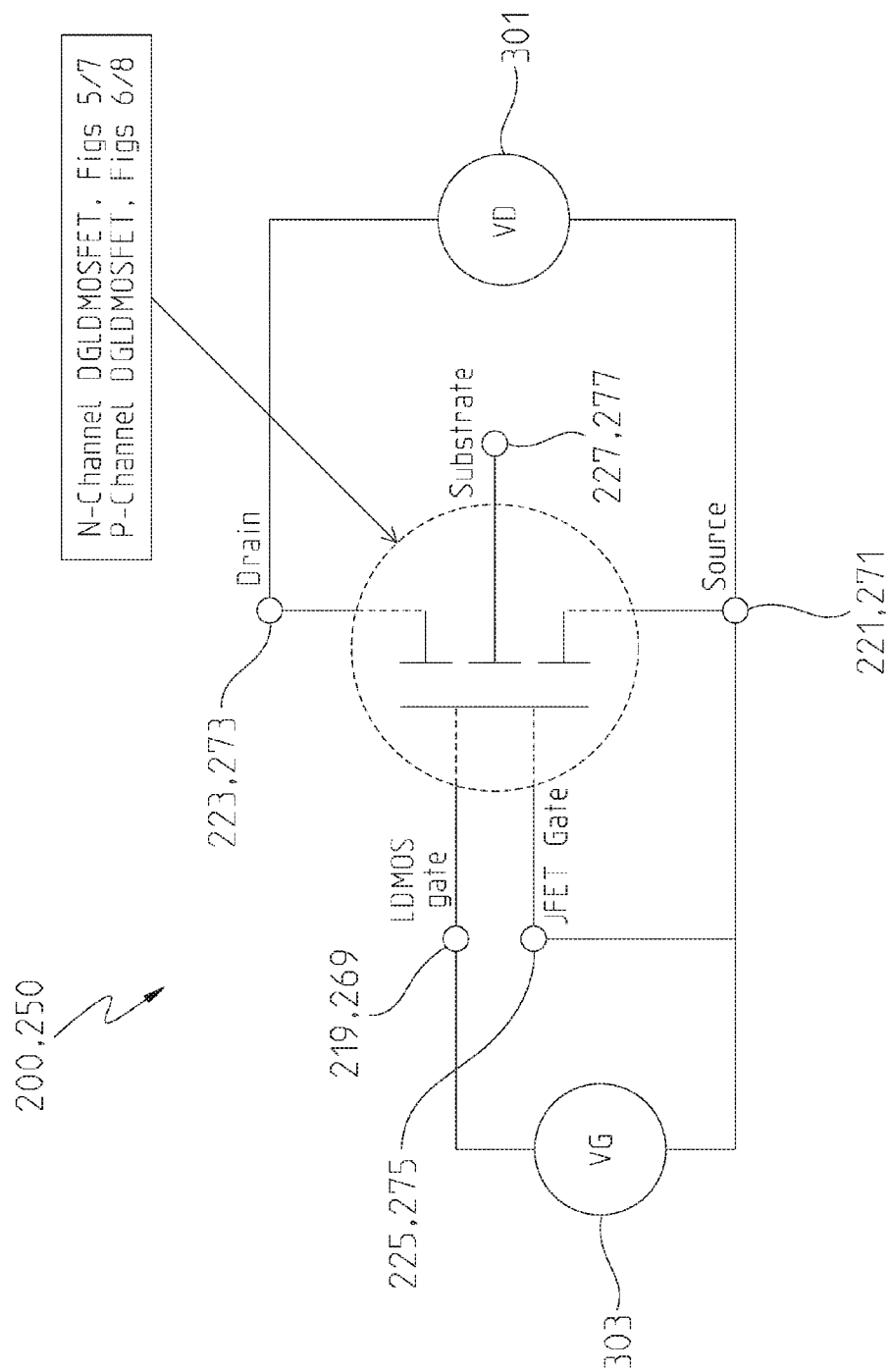
FIG. 10 shows an exemplary DGLDMOSFET configured to operate in one standard DC mode configuration in accordance with one embodiment of the invention.
Figure 11:
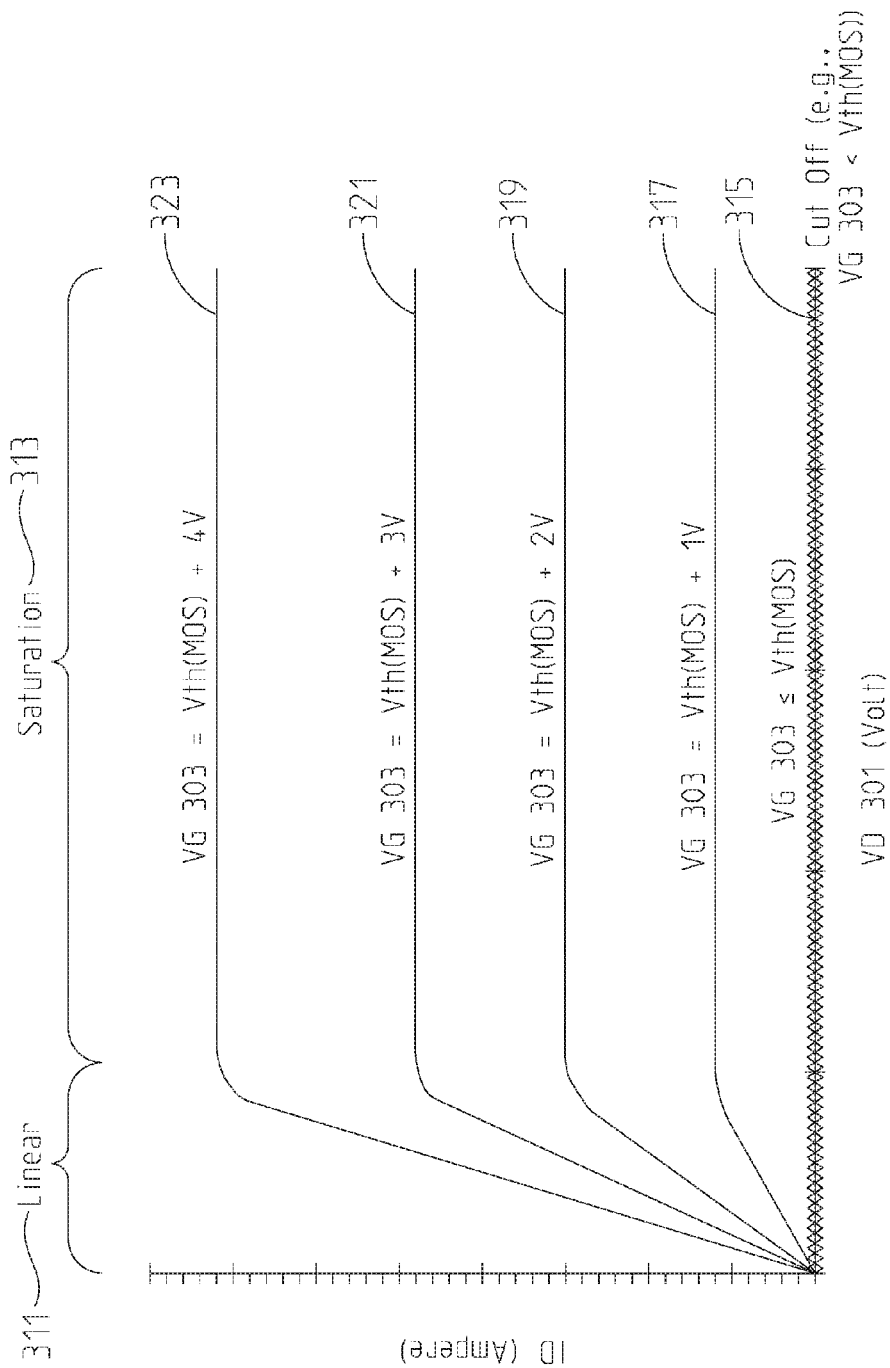
FIG. 11 shows an exemplary current-voltage (I-V) response (operation of an exemplary standard DC mode configuration of FIG. 10) in accordance with one embodiment of the invention.

FIG. 10 shows an exemplary application (Standard DC Mode Configuration) of exemplary DGLDMOSFET 200, 250 using electrical representations shown in FIG. 9 in accordance with one embodiment of the invention. FIG. 10 exemplary electrical representation shows external gate power VG 303 connected to a LDMOSFET control gate 219, 269; an external power VD 301 connected to a drain 223, 273; and external circuit common (e.g., ground) connected to a source 221, 271 and a JFET control gate 225, 275 coupled to exemplary DGLDMOSFET embodiment 200, 250. Referring back to FIGS. 5/7 and 6/8 in view of FIG. 10, if JFET gate 225, 275 is connected directly to a source 219, 269, an exemplary embodiment of the exemplary DGLDMOSFET 200, 250 can be configured to function similar to a standard LDMOSFET providing similar electrical characteristics and performance of a standard LDMOSFET. FIG. 11 shows an example of five exemplary standard DC mode I-V responses or outputs (I-V responses 315, 317, 319, 321 and 323) from FIG. 10 exemplary application (Standard DC Mode configuration) in accordance with one embodiment of the invention. FIG. 11 also provides three regions of exemplary operation (cut-off 315, linear 311, and saturation 313). Cut-off 315 is operable in FIG. 10 exemplary application if external power VG 303 delivers a voltage to gate less than LDMOSFET's control gate threshold voltage Vth (LDMOS) to effect a reduction or elimination of DGLDMOSFET's current flow through LDMOSFET's semi-conductive channel region 229, 279.

Linear 311 is operable in FIG. 10 exemplary application if external power VG 303 delivers a voltage to gate greater than LDMOSFET's control gate threshold voltage Vth (LDMOS) to effect an exemplary resistive DGLDMOSFET current flow through LDMOSFET's semi-conductive channel region 229, 279, where external power VD 301 delivers a voltage to drain less than the difference of VG 303 and Vth (LDMOS). Saturation 313 is operable in FIG. 10 exemplary application if external power VG 303 delivers a voltage to gate greater than LDMOSFET's control gate threshold voltage Vth (LDMOS) to effect exemplary saturated DGLDMOSFET current flow (saturation) through LDMOSFET's semi-conductive channel region 229, 279, where external power VD 301 delivers a voltage to drain greater than the difference of VG 303 and Vth (LDMOS). FIG. 11 does not necessarily represent an actual DGLDMOSFET's I-V response but is only provided to show how one embodiment of an exemplary DGLDMOSFET can operate in a standard DC mode configuration.

Figure 12:
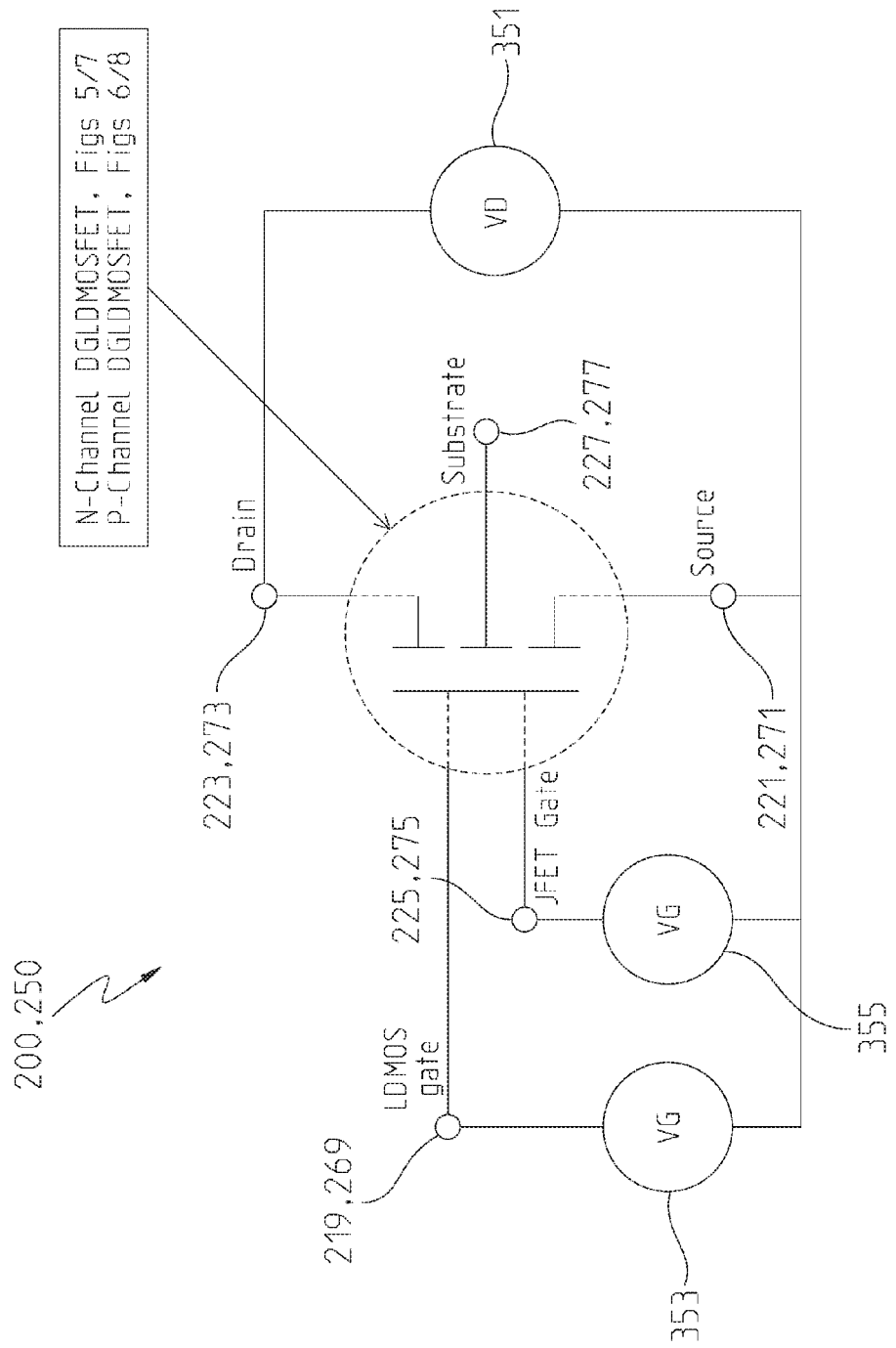
FIG. 12 shows an exemplary DGLDMOSFET configured to operate in one enhanced DC mode configuration in accordance with one embodiment of the invention.

FIG. 12 shows an exemplary application (Enhanced DC mode configuration) of exemplary DGLDMOSFET 200, 250 using electrical representations shown in FIG. 9 in accordance with one embodiment of the invention. FIG. 12 exemplary electrical representation shows external power VG 353 connected to LDMOSFET gate 219, 269; external power VG 355 connected to JFET control gate 225, 275; external power VD 351 connected to drain 223, 273; and external power common (e.g., ground) connected to a source 221, 271 coupled to exemplary DGLDMOSFET embodiment 200, 250. In this exemplary configuration, LDMOSFET control gate 219, 269 and JFET control gate 225, 275 can be used separately or together to assist in controlling exemplary DGLDMOSFET's current flow. Exemplary DGLDMOSFET 200, 250 can be configured to function similar to a standard LDMOSFET (e.g., set external power VG 355 to zero volts) providing similar electrical and performance of a standard LDMOSFET; can be configured to function similar to a standard JFET (e.g., set external power VG 353 to a fixed voltage greater than the LDMOSFET's threshold voltage) providing similar electrical and performance of a standard JFET; or can be configured to function where both JFET and LDMOSFET interact (e.g., configure external power VG 353 and VG 355 to allow current flow control) providing similar electrical and performance of two transistors connected in series. In this exemplary configuration, exemplary DGLDMOSFET 200, 250 offers enhanced operational and performance capabilities with respect to TID, SEB, and SEGR. Enhanced TID performance can occur because exemplary JFET gate 225, 275 continues to function with high levels of TID exposure (e.g., TID>1 Mrd) and continues to control current flow through the DGLDMOSFET's semi-conducting channel region 231, 281 after LDMOSFET control gate 221, 261 becomes non-functional due to TID-induced threshold voltage shifts. Enhanced SEGR performance can occur because exemplary JFET 239, 289 can be used to produce a depletion field 235, 285 (e.g., as shown in FIGS. 7 and 8), where a depletion field 235, 285 provides a barrier to retard a drain potential from coupling to exemplary DGLDMOSFET gate dielectric 217, 267 during a heavy ion strike. Enhanced SEGR performance can also occur because LDMOSFET SCR 229, 279 can be configured to conduct current (e.g., FIG. 13, linear 361 or saturation 363) and JFET SCR 231, 281 can be configured to control current (e.g., FIG. 14, cut-off 379), where under this exemplary configuration coupling of drain voltage to gate dielectric 217, 267 is minimized. Enhanced SEB performance can occur because exemplary JFET 239, 289 can be used to produce a depletion field 235, 285, where formation of depletion field 235, 285 collects a portion of heavy-ion generated photocurrent to effect a reduction in heavy-ion generated photocurrent collected through LDMOSFET P body 205, 255. Enhanced SEB performance can also occur because LDMOSFET SCR 229, 279 can be configured to conduct current (e.g., FIG. 13, linear 361 or saturation 363) and JFET SCR 231, 281 can be configured to control current (e.g., FIG. 14, cut-off 379), where under this exemplary configuration a portion of heavy-ion generated photocurrent is collected directly through electrical current path 233, 283 reducing heavy-ion generated photocurrent collected through LDMOSFET body 205, 255.

Figure 13:
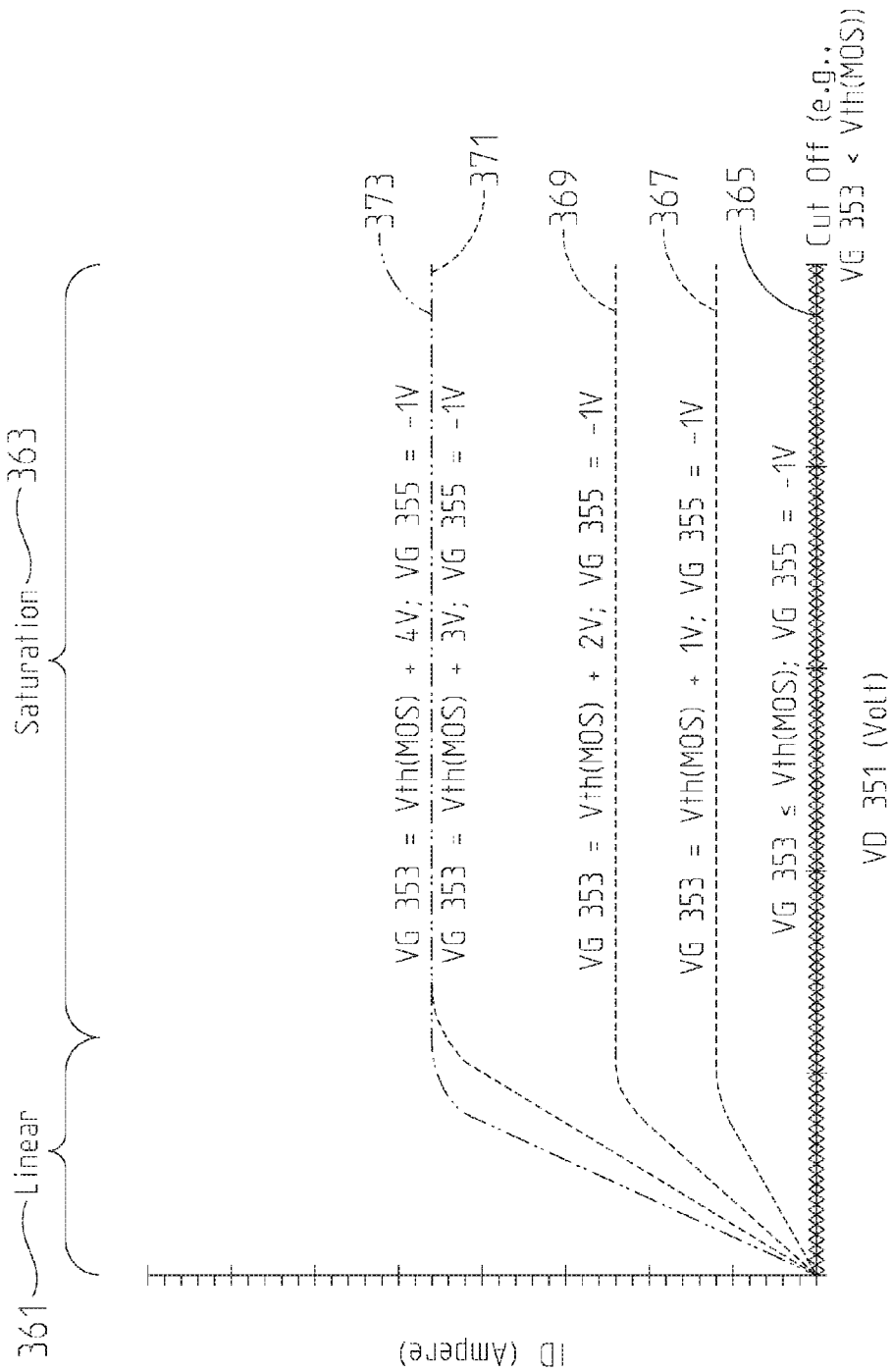
FIG. 13 shows an exemplary current-voltage (I-V) response (operation of exemplary enhanced DC mode configuration of FIG. 12) associated with one element (e.g., LDMOSFET gate control)

FIG. 13 shows an exemplary current-voltage (I-V) response of exemplary DGLDMOSFET 200, 250 when exemplary JFET control gate 225, 275 is fixed at constant voltage and LDMOSFET control gate 219, 269 is used to modulate current flow. FIG. 13 provides examples of five exemplary enhanced DC mode I-V responses or outputs (I-V responses 365, 367, 369, 371 and 373) of FIG. 12 exemplary application (enhance DC mode configuration) in accordance with one embodiment of the invention. FIG. 13 also provides three examples of exemplary operation (cut-off 365, linear 361, and saturation 363). Cut-off 365 can be operable in FIG. 12 exemplary application if external power VG 353 delivers a voltage less than LDMOSFET's control gate threshold voltage Vth (LDMOS) to effect a reduction or elimination of exemplary DGLDMOSFET's current flow through LDMOSFET's semi-conductive channel region 231, 281. Linear 361 can be operable in FIG. 12 exemplary application if external power VG 353 delivers a voltage greater than LDMOSFET's control gate threshold voltage Vth (LDMOS) to operate in a resistive DGLDMOSFET current flow through LDMOSFET's semi-conductive channel region 231, 281, where external power VD 351 delivers a voltage less than the difference of VG 353 and Vth (LDMOS). Saturation 363 can be operable in FIG. 12 exemplary application if external power VG 353 delivers a voltage greater than LDMOSFET's control gate threshold voltage Vth (LDMOS) to operate in a DGLDMOSFET current-limited flow (saturation) through LDMOSFET's semi-conductive channel region 231, 281, where external power VD 351 delivers a voltage greater than the difference of VG and Vth (LDMOS).

Figure 14:
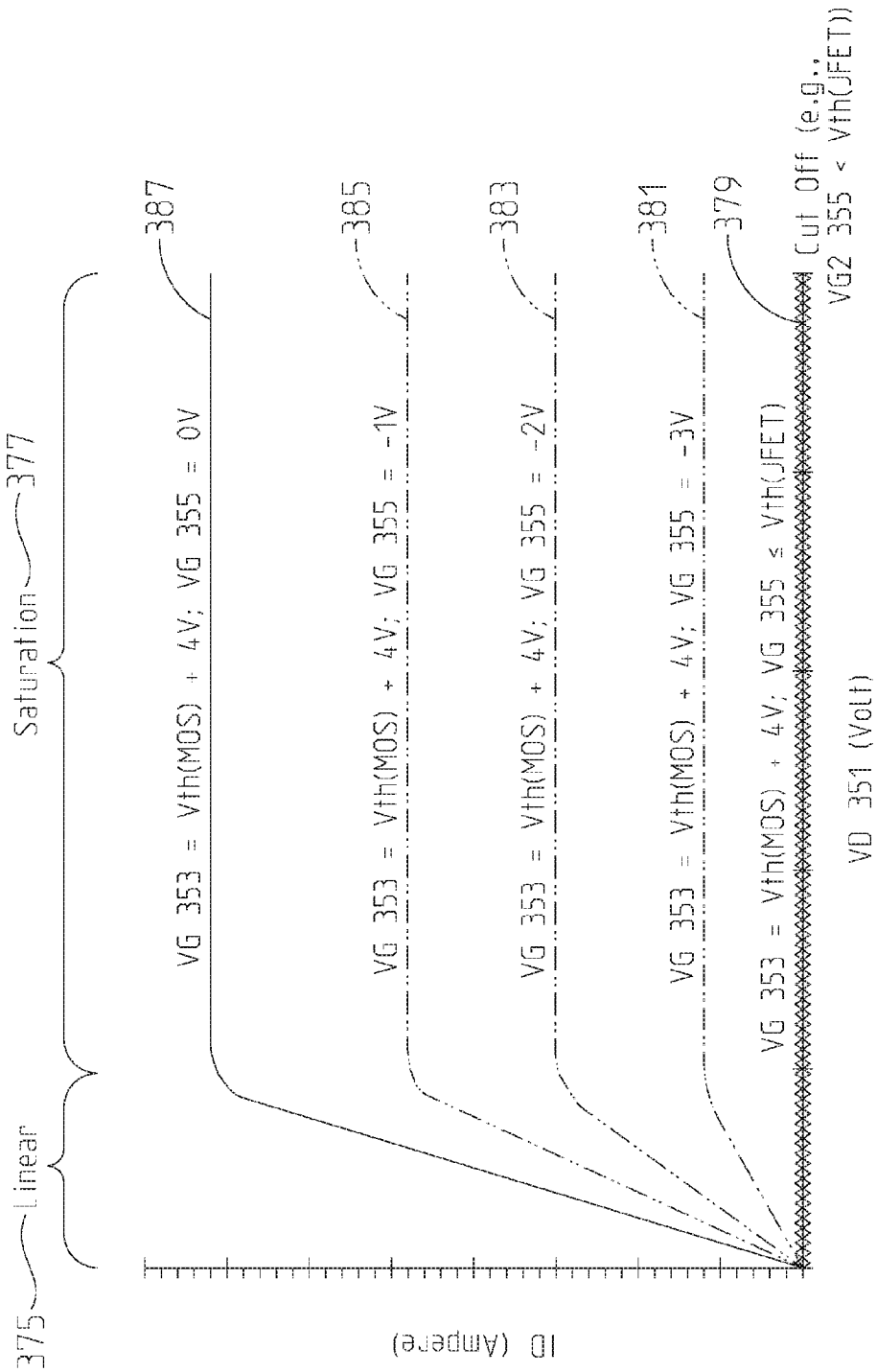
FIG. 14 shows an exemplary current-voltage (I-V) response (operation of exemplary enhanced DC mode configuration of FIG. 12) associated with another element (e.g., JFET gate control)

FIG. 14 shows a current-voltage (I-V) characteristic of exemplary DGLDMOSFET 200, 250 when exemplary LDMOSFET control gate 219, 269 is at a fixed voltage and JFET gate 225, 275 is used to modulate current flow. FIG. 14 provides examples of five exemplary responses or outputs (I-V responses 379, 381, 283, 385 and 387) of enhanced DC mode operation from FIG. 12 exemplary application in accordance with one embodiment of the invention. FIG. 14 also provides three examples of exemplary operation, cut-off 379, linear 375, and saturation 377. Cut-off 379 can be operable in FIG. 12 exemplary application when external power VG 355 delivers a voltage less than JFET's control gate threshold voltage Vth (JFET) to effect a reduction or elimination of exemplary DGLDMOSFET's current flow through JFET's semi-conductive channel region 231, 281. Linear 375 can be operable in FIG. 12 exemplary application when external power VG 355 delivers a voltage greater than JFET's control gate threshold voltage Vth (JFET) to enter an exemplary resistive DGLDMOSFET current flow through JFET's semi-conductive channel region 231,281, where external power VD 351 delivers a voltage less than the difference of VG and Vth (JFET). Saturation 377 can be operable in FIG. 12 exemplary application when external power VG 355 delivers a voltage greater than JFET's control gate threshold voltage Vth (JFET) to enter exemplary DGLDMOSFET current-limited flow (saturation) through JFET's semi-conductive channel region 231, 281, where external power VD 351 delivers a voltage greater than the difference of VG and Vth (JFET). FIGS. 13 and 14 do not represent actual DGLDMOSFET's I-V characteristics and are provided to demonstrate application of an exemplary DGLDMOSFET operating in enhanced DC mode.

Figure 15:
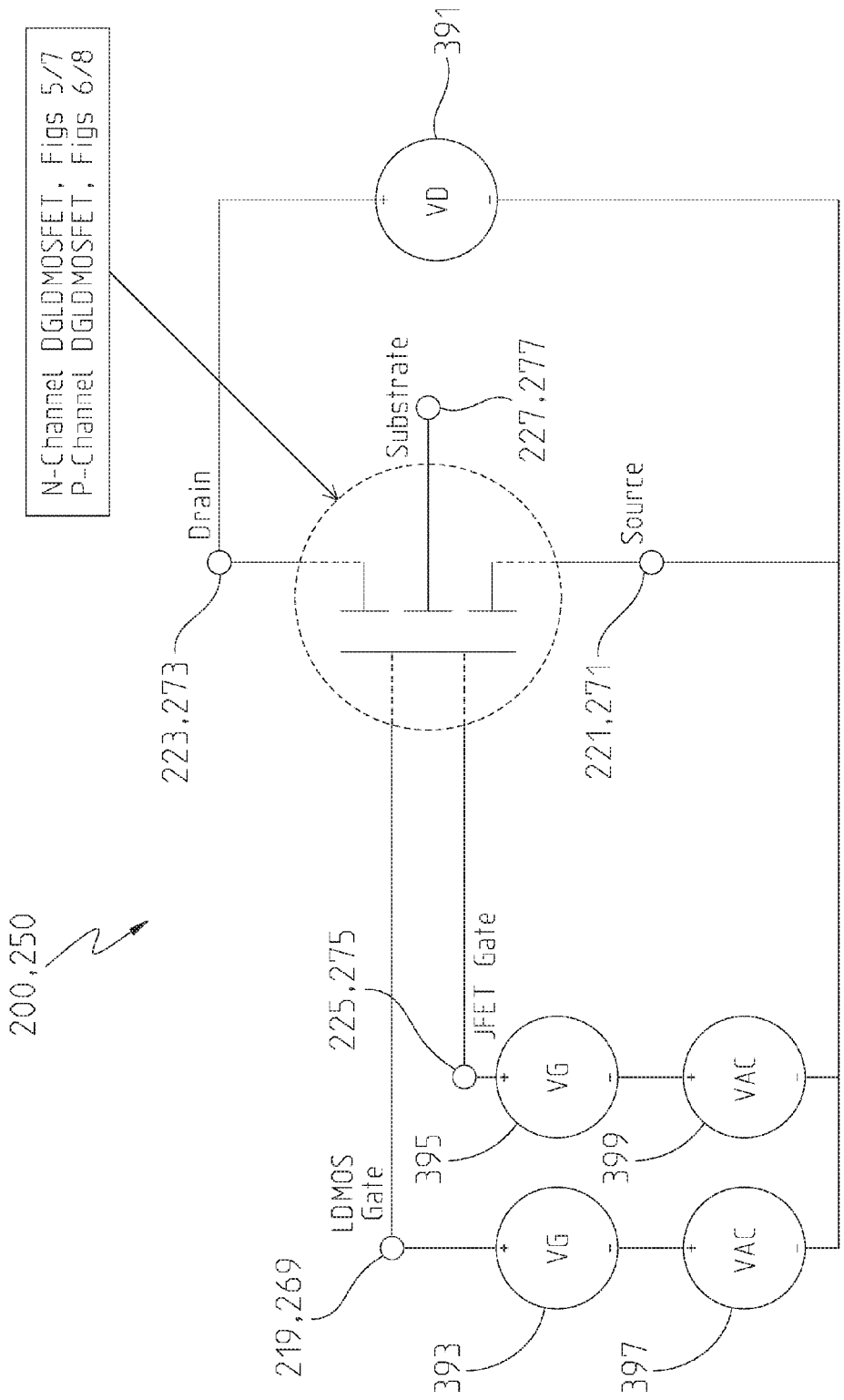
FIG. 15 shows an exemplary DGLDMOSFET configured to operate in one enhanced AC mode configuration in accordance with one embodiment of the invention.

FIG. 15 shows another exemplary application (e.g., enhanced AC mode configuration) using exemplary DGLDMOSFET 200, 250 using electrical representations shown in FIG. 9 in accordance with one embodiment of the invention. FIG. 15 exemplary electrical representation shows an external power VG 393 and an AC input VAC 397 connected to LDMOSFET control gate 219, 269; external power VG 395 and an AC input 399 connected to JFET control gate 215, 275; external power VD 391 connected to drain 223, 273; and an external common (e.g., ground) connected to source 221, 271 coupled to exemplary DGLDMOSFET embodiment 200, 250. In this exemplary application, LDMOSFET control gate 219, 269 and JFET control gate 225, 275 can be used separately or together to assist in controlling DC current flow with AC modulation in phase or out of phase providing a useful structure for a variety of radio frequency (RF) applications such as RF mixers, RF amplifiers, and RF gain control. This exemplary operational mode provides application designers functionality of two independent gates in a variety of RF type applications.

Figure 16:
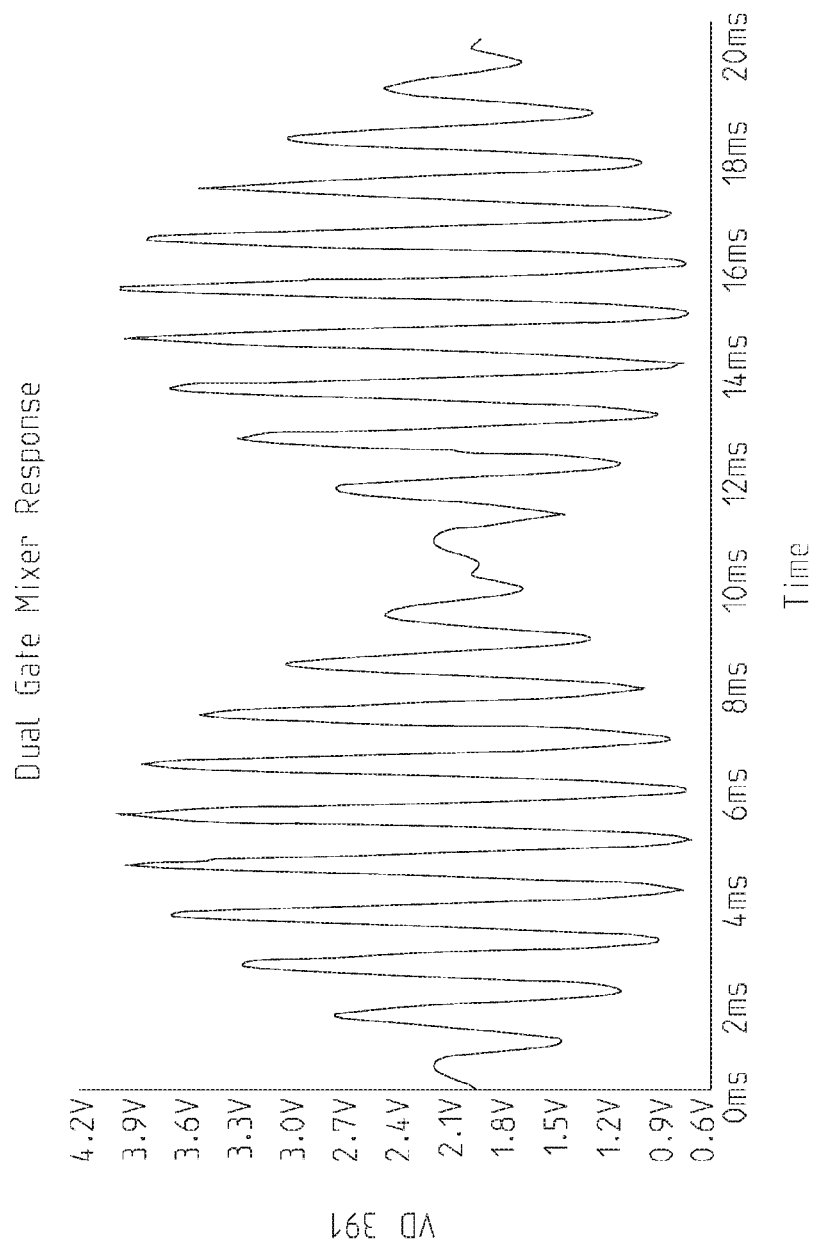
FIG. 16 shows an exemplary RF output (operation of exemplary enhanced AC mode configuration of FIG. 15) associated with two elements (e.g., LDMOSFET gate control and JFET gate control)

FIG. 16 represents an exemplary output of a RF mixer type application. FIG. 16 does not represent an actual DGLDMOSFET output and is provided to demonstrate application of an exemplary DGLDMOSFET operating in enhanced DC mode.

Figure 17A:
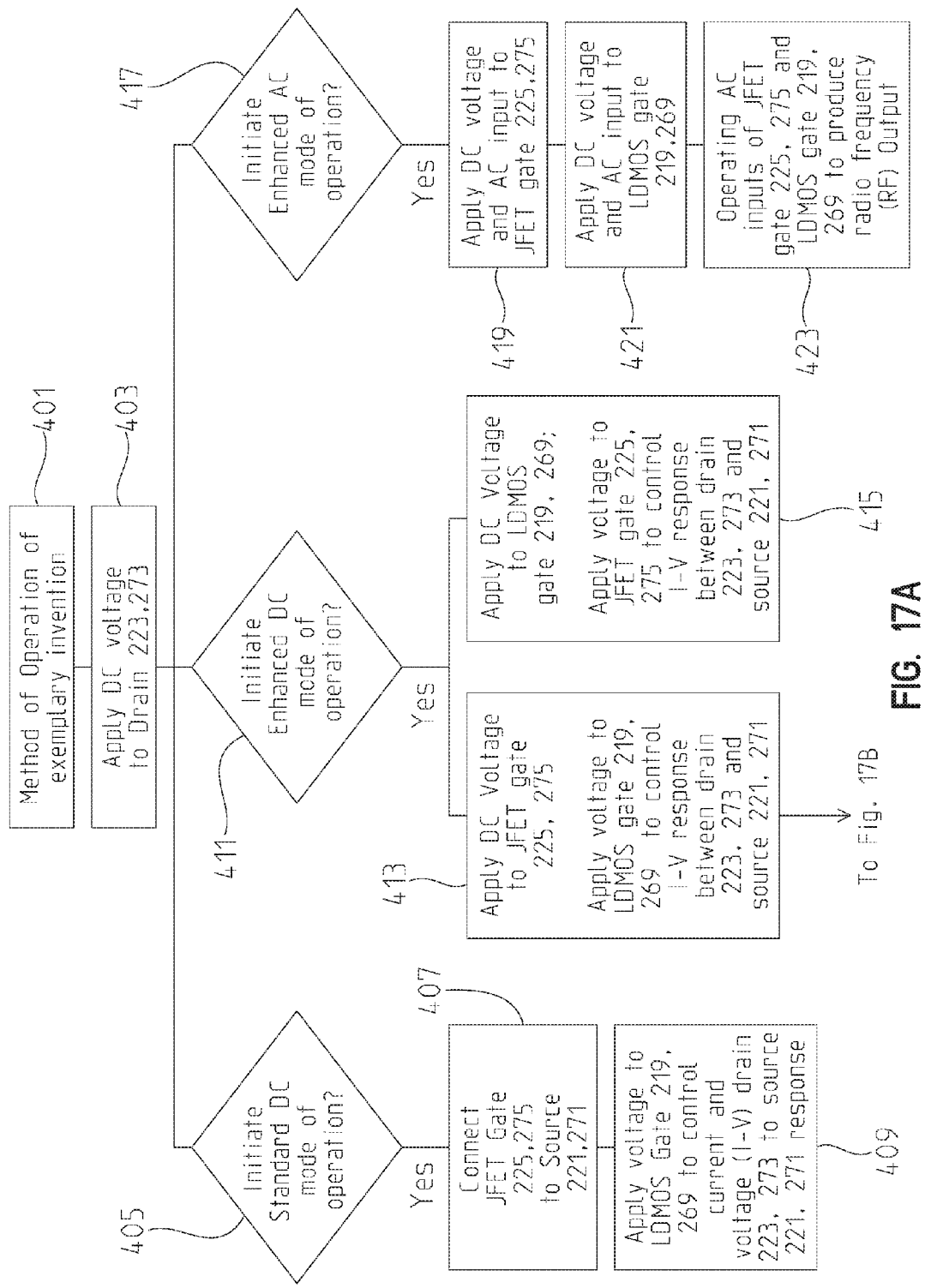
FIGS. 17A and 17B show an exemplary method of operation of exemplary embodiments of the invention comprising various modes of operation.
Figure 17B:
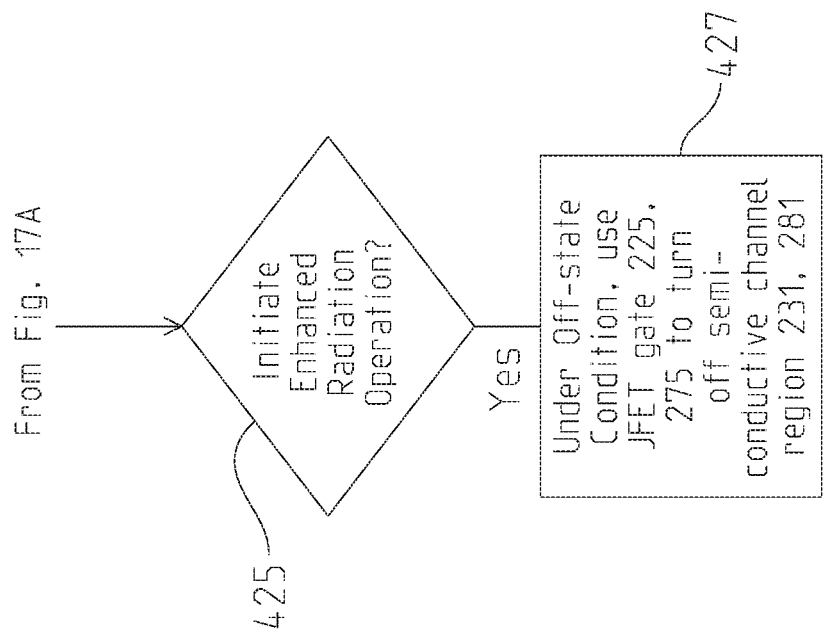

FIGS. 17A and 17B show exemplary methods of operation 401 of exemplary embodiments of the invention. These methods of operation can be triggered based on determinations that operation of one or more functionalities of an exemplary embodiment of the invention is needed such as, for example, detecting a condition to alter operation of exemplary semiconductive channel region from LDMOSFET control gate control to JFET control gate control in response to an electromagnetic interference event. Another determination for need to operate exemplary functionality is determining additional or different current or voltage control operations are desirable such as in RF system operation such as described above. Once a determination of a need for operation has been determined, operation of an exemplary embodiment of the invention can commence such as, for example, at step 405, a standard DC mode of operation can be initiated comprising providing an exemplary embodiment of the invention such as described above; at step 407, connecting JFET control gate 225, 275 to a source 221, 271; at step 403, applying DC voltage to a drain 223, 273; and at step 409, applying a voltage to a LDMOSFET control gate 219, 269 to a control current/voltage output. A second mode can comprise initiating an enhanced DC mode of operation using a system such as described herein/above at step 411; at step 403, apply a DC voltage to a drain 223, 273; and steps 413/415 can be executed concurrently or separately to a control current/voltage output between drain 223, 273 and source 221, 271 by applying a DC voltage to a JFET control gate 225, 275, a DC voltage to a LDMOSFET control gate 219, 269, or DC voltages to both to control a current/voltage output. If operating under LDMOSFET control gate control only, another mode can comprise initiating enhanced radiation mode of operation using a system such as described herein/above at step 425 and at step 427, to alter operational control from LDMOSFET semiconductive channel region to operation control of JFET semiconductive channel region 231, 281. Enhanced radiation mode of operation extends operational performance in radiation environment (e.g., TID, SEB, and SEGR). Another mode can comprise initiating an enhanced AC mode of operation in accordance with an exemplary embodiment of the invention using a system such as described herein/above at step 417; at step 403, applying a DC voltage to a drain 223, 273; at step 419, applying a DC voltage and an AC input to JFET control gate 225, 275; at step 421, applying a DC voltage and an AC input to LDMOSFET control gate 219, 269; and at step 423, applying an AC input to JFET control gate 225, 275, applying an AC input to LDMOSFET gate 219, 269, or applying AC inputs to both gates to produce a RF output.

Figure 18A:
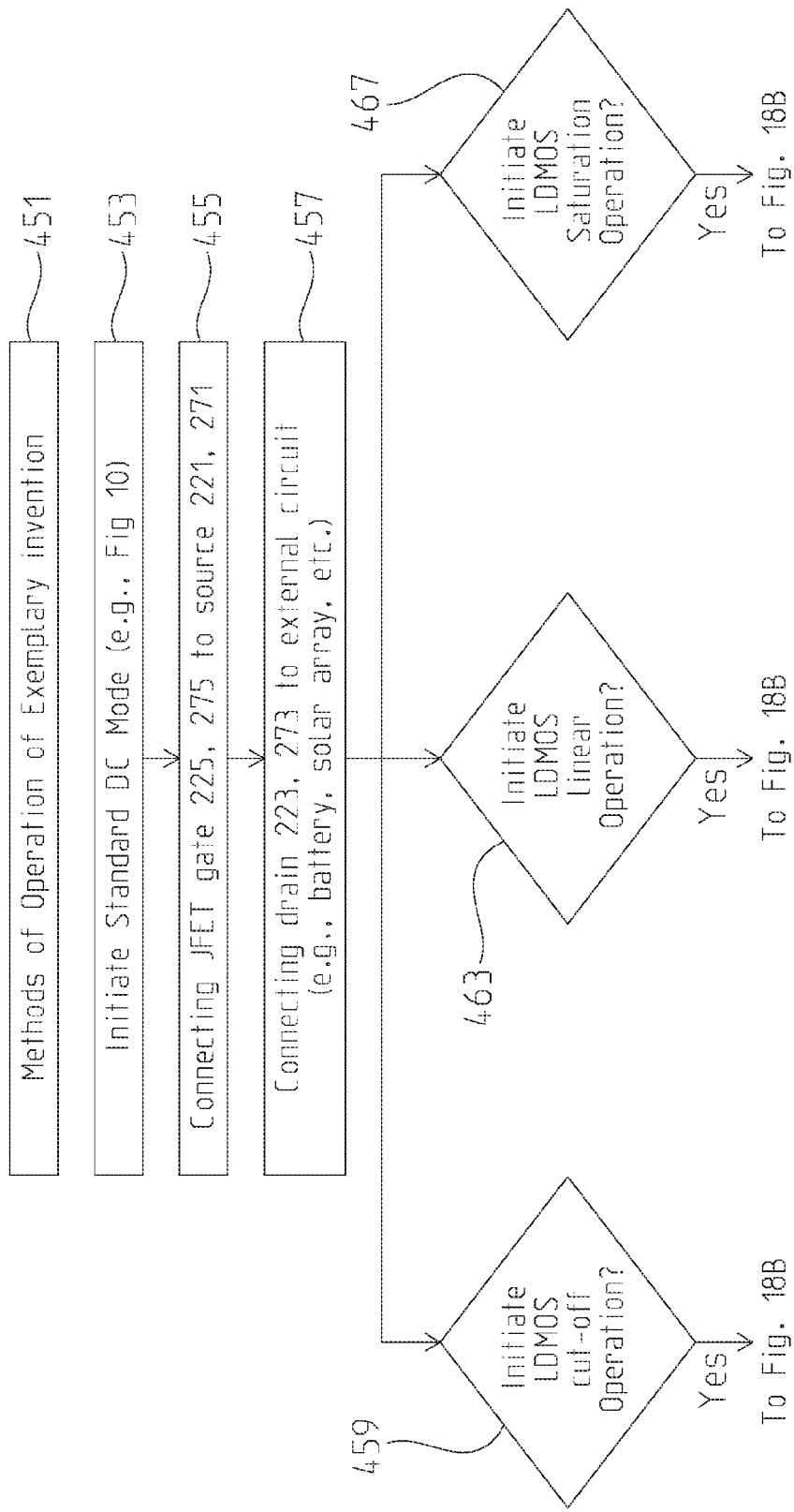
Figure 18C:
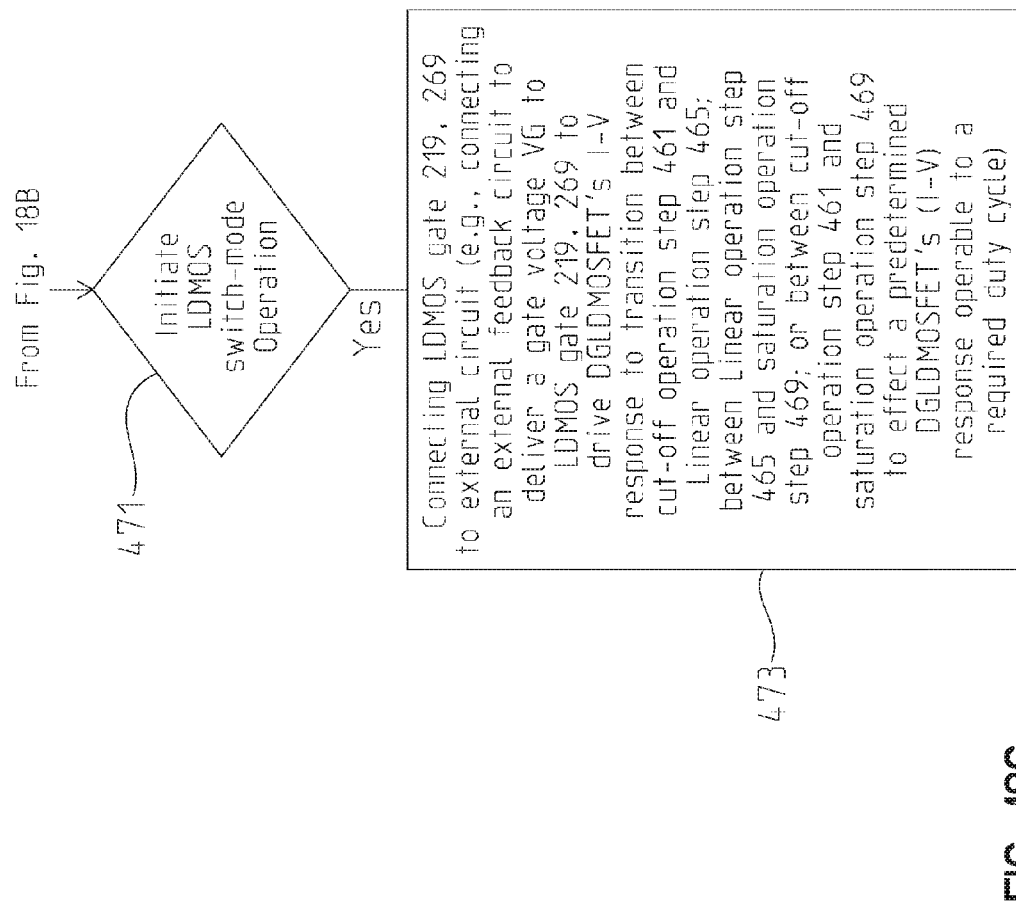

FIGS. 18A, 18B and 18C show another exemplary method of operation 451 in accordance with another embodiment of the invention. A process begins by initiating standard DC mode operation at step 453; connecting a JFET control gate 225, 275 to a source 221, 271 at step 455; and connecting a drain 223, 273 to an external circuit (e.g., power supply) at step 457. Another process decision is a determination depending upon system requirements of how to configure exemplary functionality such as whether to initiate LDMOSFET cut-off mode operation at step 459; whether to initiate LDMOSFET linear mode operation at step 463; whether to initiate LDMOSFET saturation mode operation at step 467; or whether to initiate LDMOSFET switch-mode operation at step 471. LDMOSFET cut-off mode at step 459 is initiated at step 461 by connecting LDMOSFET control gate 219, 269 to an external circuit that delivers a gate voltage to LDMOSFET control gate 219, 269 up to a voltage less than LDMOSFET's control gate threshold voltage Vth (LDMOS) to effect a reduction or elimination of exemplary DGLDMOSFET current flow through LDMOSFET's semi-conductive channel region 229, 279. LDMOSFET linear mode at step 463 is initiated at step 465 by connecting LDMOSFET control gate 219, 269 to an external circuit that delivers a gate voltage to LDMOSFET control gate 219, 269 that is greater than LDMOSFET's control gate threshold voltage Vth (LDMOS) to effect and to modulate a resistive current-voltage (I-V) response through LDMOSFET's semi-conductive channel region 229, 279. Operation in linear mode at step 465 requires drain voltage VD to be less than a difference of applied gate voltage VG and LDMOSFET's control gate threshold voltage Vth (LDMOS) (e.g., VD<VG−Vth (LDMOS)). LDMOSFET saturation mode at step 467 is initiated at step 469 by connecting LDMOSFET control gate 219, 269 to an external circuit that delivers a gate voltage to LDMOSFET control gate 219, 269 that is greater than LDMOSFET's control gate threshold voltage Vth (LDMOS) to effect and to modulate a saturated current-voltage (I-V) response through LDMOSFET's semi-conductive channel region 229, 279. Operation in saturation mode at step 469 requires drain voltage VD to be greater than a difference of applied gate voltage VG and LDMOSFET's control gate threshold voltage Vth (LDMOS) (e.g., VD>VG−Vth (LDMOS)). LDMOSFET switch-mode operation at step 471 is initiated at step 473 by connecting LDMOSFET control gate 219, 269 to an external circuit to deliver a gate voltage VG to LDMOSFET control gate 219, 269 to alternate exemplary DGLDMOSFET's I-V response between LDMOSFET cut-off operation at step 461 and LDMOSFET linear operation at step 465; between LDMOSFET linear operation at step 465 and LDMOSFET saturation operation at step 469; or between LDMOSFET cut-off operation at step 461 and LDMOSFET saturation operation at step 469 to effect a predetermined exemplary DGLDMOSFET's (I-V) response operable at a duty cycle to effect a predetermined I-V response.

Figure 19:
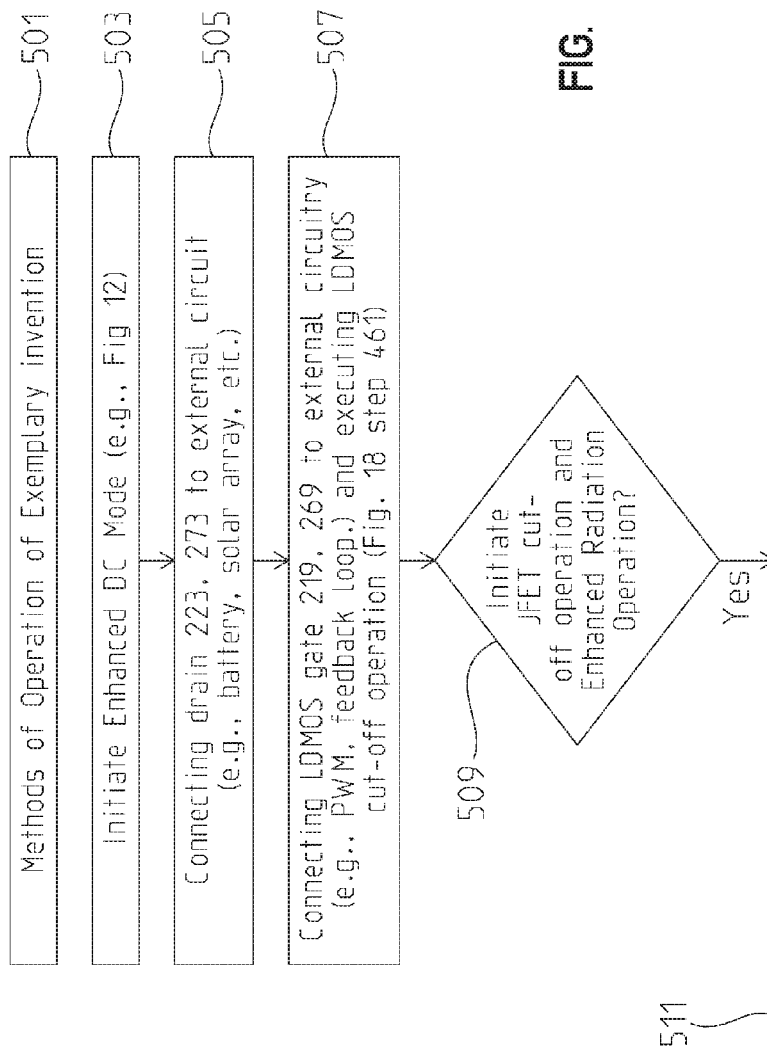
FIG. 19 shows an exemplary method of operation of an exemplary embodiment of the invention comprising another mode of operation.

FIG. 19 shows another exemplary method of operation 501 in accordance with another embodiment of the invention. Again, a process begins by initiating enhanced DC mode operation at step 503; connecting drain 223, 273 to an external circuit (e.g., power supply) at step 505; and connecting LDMOSFET control gate 219, 269 to an external circuit executing LDMOSFET cut-off mode operation (e.g., FIG. 18B, step 461) at step 507. Another process decision is a determination depending upon system requirements (e.g., radiation detector) to initiate JFET cut-off mode operation/ enhanced radiation mode operation at step 509. Enhanced radiation mode operation at step 509 is initiated by connecting JFET control gate 225, 275 to an external circuit that delivers a gate voltage to JFET control gate 225, 275 that is less than JFET's control gate threshold voltage Vth (JFET) to effect a reduction or elimination of DGLDMOSFET current flow by altering operational control from LDMOSFET's semi-conductive channel region 229, 279 (e.g. LDMOSFET gate control) to JFET's semi-conductive channel region 231, 281 (e.g., JFET control gate) at step 511.

Figure 20A:
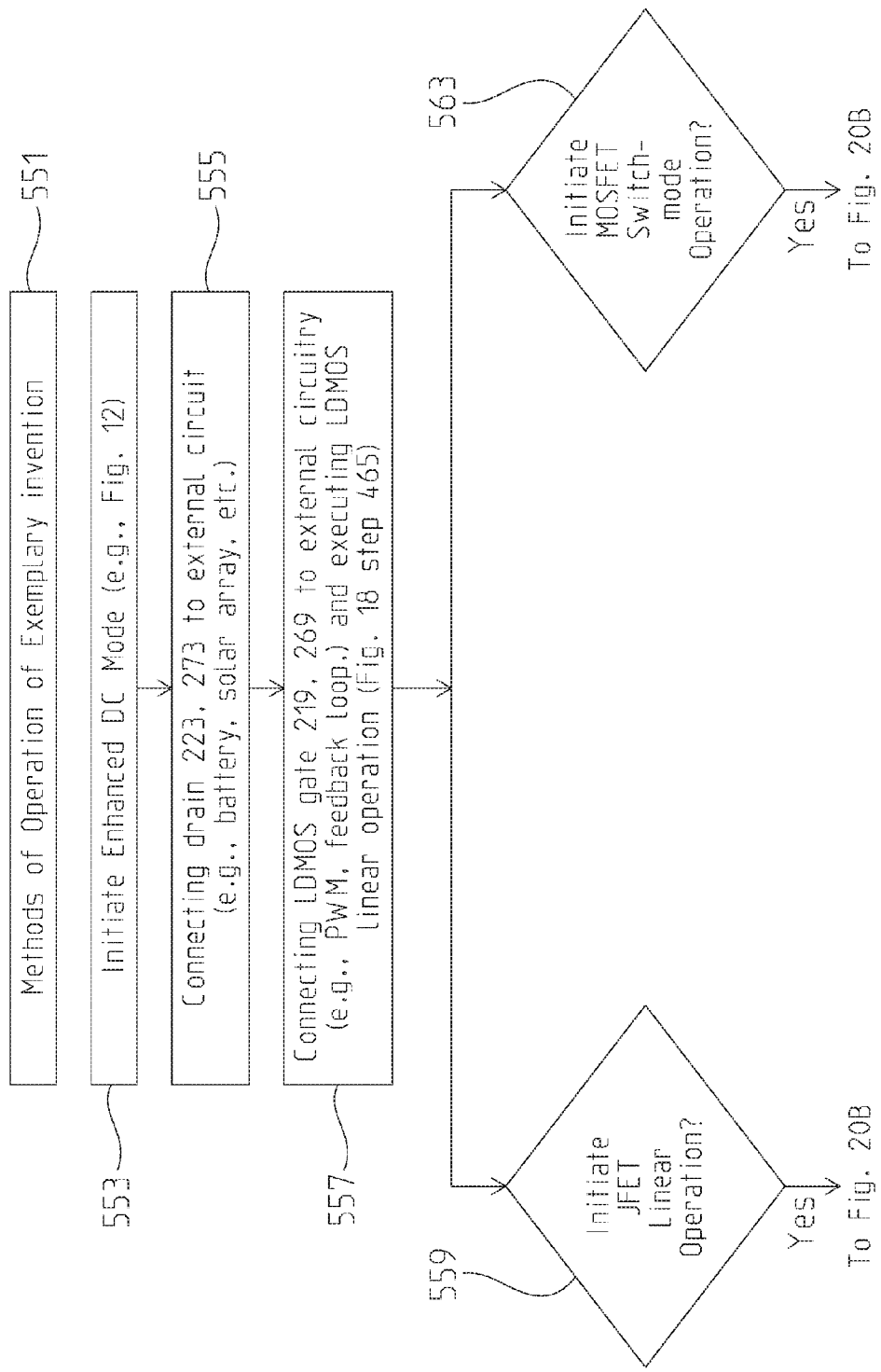
Figure 20C:
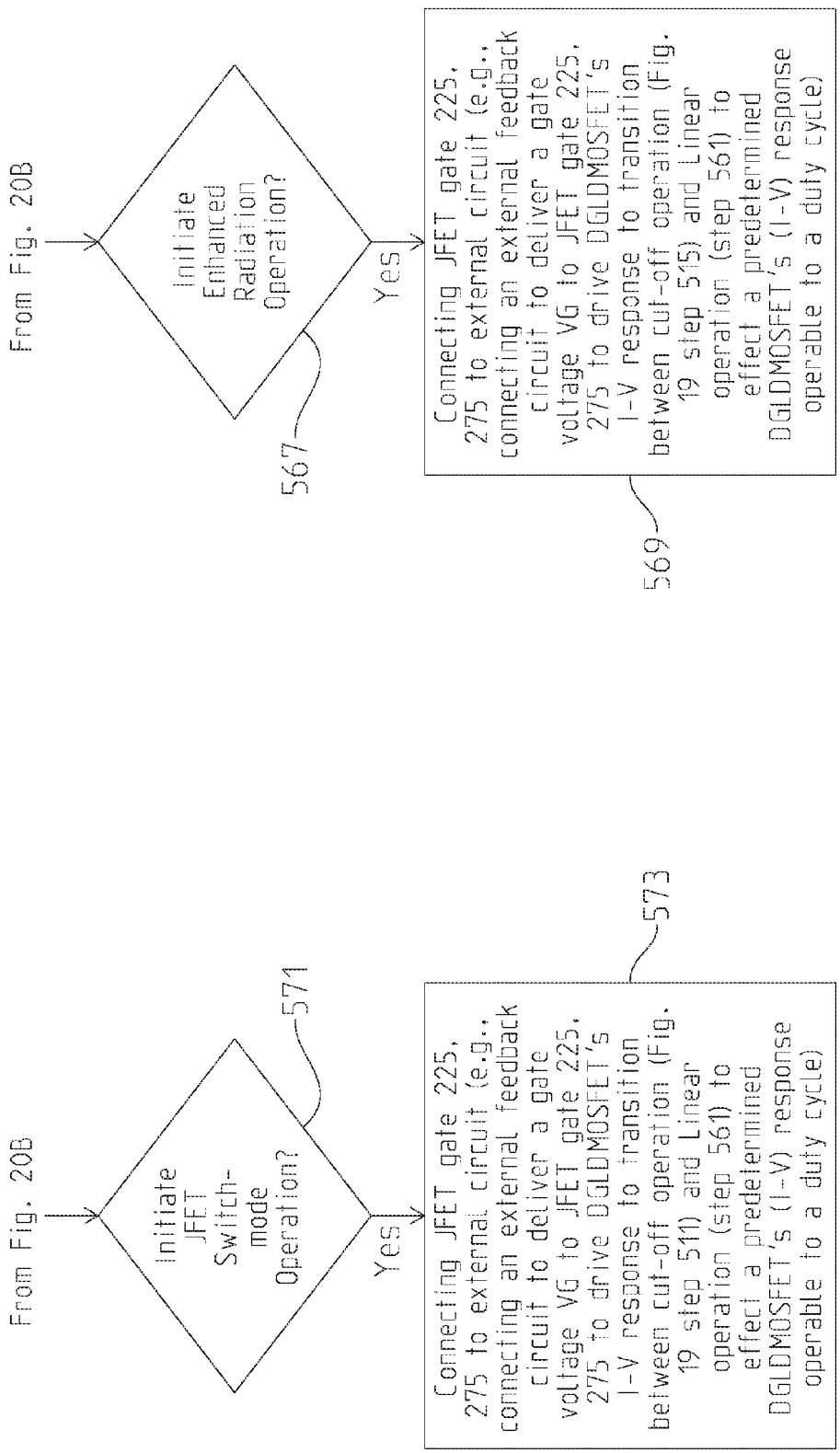

FIGS. 20A, 20B and 20C show another exemplary method of operation 551 in accordance with another embodiment of the invention. Again, a process begins by initiating enhanced DC mode operation at step 553; connecting drain 223, 273 to an external circuit (e.g., power supply) at step 555; and connecting LDMOSFET control gate 219, 269 to an external circuit executing LDMOSFET linear mode operation at step 557 (e.g., FIG. 18B, step 465). Another processing decision is a determination depending upon system requirements of how to configure exemplary functionality such as whether to initiate JFET linear mode operation at step 559 or to initiate LDMOSFET switch-mode operation at step 563. JFET linear mode operation at step 559 is initiated by connecting JFET control gate 225, 275 to an external circuit that delivers a gate voltage to JFET control gate 225, 275 that is greater than JFET's control gate threshold voltage Vth (JFET) to determine system conditions and to alter DGLDMOSFET's resistive current-voltage (I-V) response through JFET's semi-conductive channel region 231, 281 at step 561. Another determination depending upon system requirements (e.g., linear regulator) is whether or not to initiate JFET switch-mode operation at step 571. JFET switch-mode operation at step 571 is initiated by connecting JFET control gate 225, 275 to an external circuit to deliver a gate voltage VG to JFET control gate 225, 275 to alternate DGLDMOSFET's I-V response between cut-off mode operation (e.g., FIG. 19 step 511) and linear mode operation at step 561 to effect a predetermined DGLDMOSFET's (I-V) response operable at a duty cycle to effect a predetermined I-V response at step 573. LDMOSFET switch-mode operation at step 563 is initiated by connecting LDMOSFET control gate 219, 269 to an external circuit to deliver a gate voltage VG to LDMOSFET control gate 219, 269 to alternate exemplary DGLDMOSFET's I-V response between LDMOSFET cut-off mode operation (e.g., FIG. 18B step 461) and LDMOSFET linear mode operation (e.g., FIG. 18B step 465) to effect a predetermined exemplary DGLDMOSFET's (I-V) response operable at a duty cycle to effect a predetermined I-V response at step 565. Another determination depending upon system requirements (e.g., radiation detector) is whether or not to initiate enhanced radiation mode operation at step 567. Enhanced radiation mode operation at step 567 is initiated by connecting JFET control gate 225, 275 to an external circuit to deliver a gate voltage VG to JFET control gate 225, 275 to alter exemplary DGLDMOSFET's I-V response between JFET cut-off mode operation (FIG. 19 step 515) and JFET linear mode operation at step 561 to effect a predetermined exemplary DGLDMOSFET's (I-V) response operable at a duty cycle to effect a predetermined I-V response at step 569.

Figure 21A:
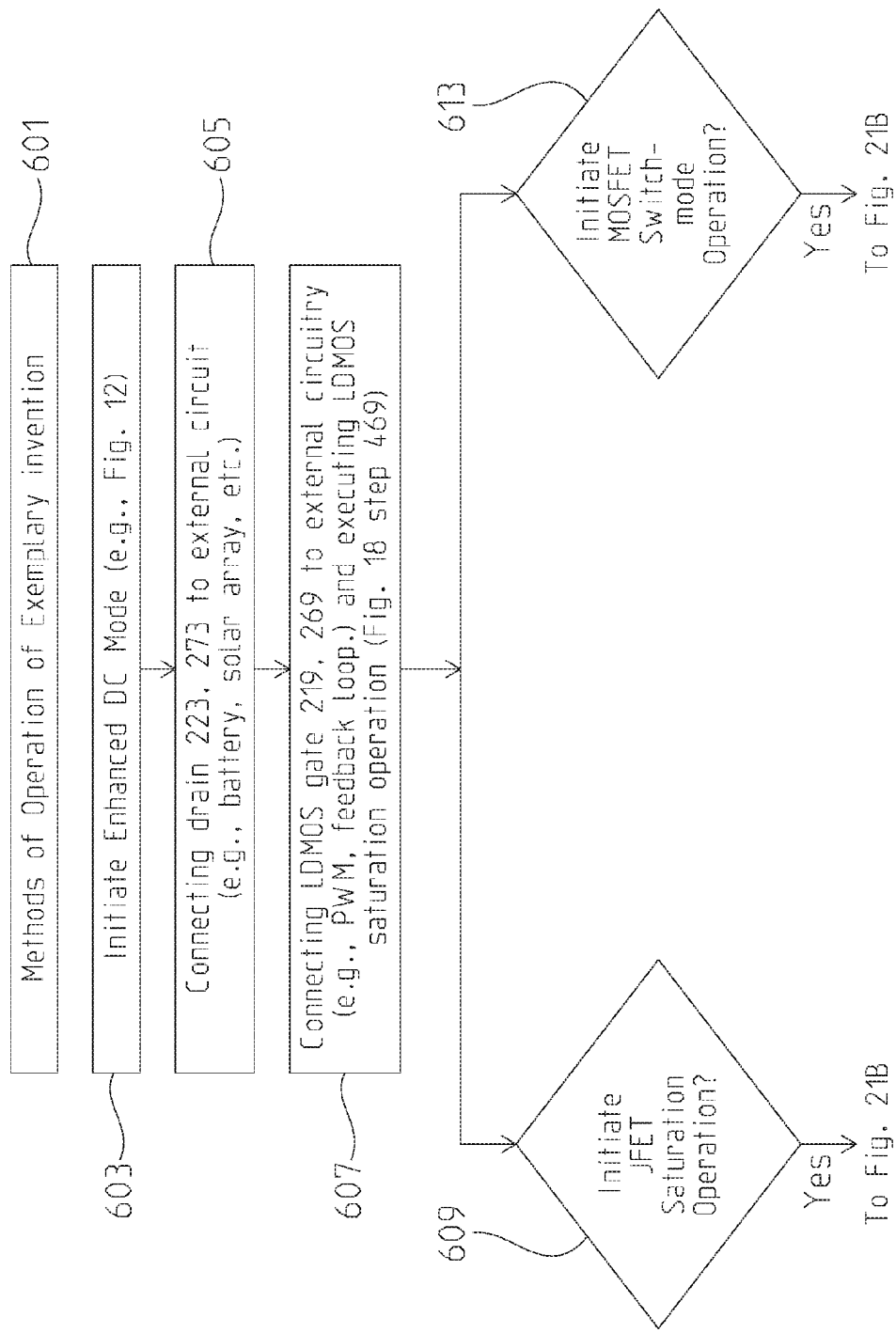
Figure 21C:
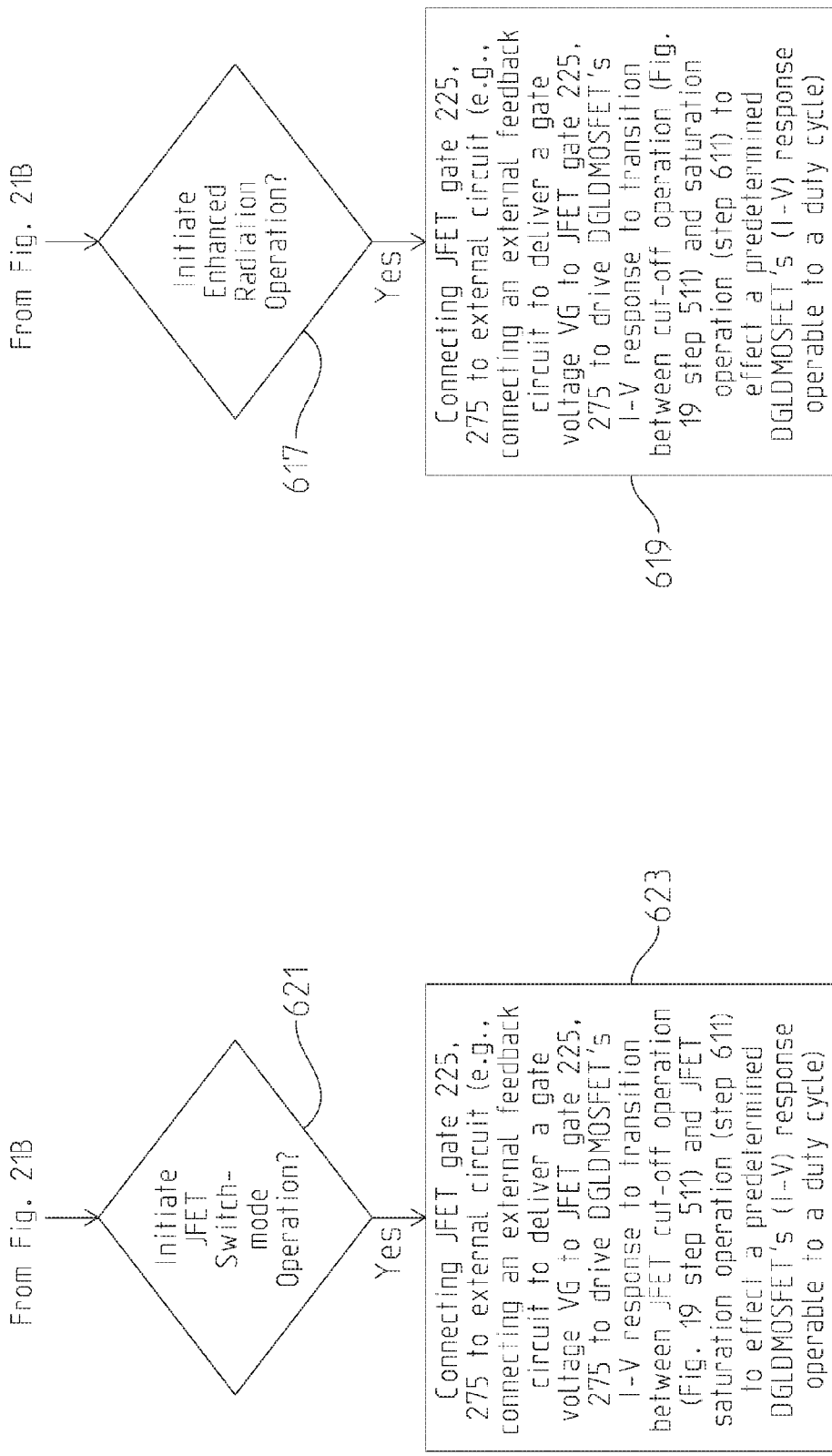

FIGS. 21A, 21B and 21C show another exemplary method of operation 601 in accordance with another embodiment of the invention. Again, a process begins by initiating enhanced DC mode at step 603; by connecting drain 223, 273 to an external circuit (e.g., power supply) at step 605; and by connecting LDMOSFET control gate 219, 269 to an external circuit executing LDMOSFET saturation mode operation at step 607 (e.g., FIG. 18B, step 469). Another determination depending upon system requirements is whether or not to to initiate JFET saturation mode operation at step 609 or to initiate LDMOSFET switch-mode operation at step 613. JFET saturation mode operation at step 609 is initiated by connecting JFET control gate 225, 275 to an external circuit that delivers a gate voltage to JFET control gate 225, 275 that is greater than JFET's control gate threshold voltage Vth (JFET) to determine system conditions and to alter exemplary DGLDMOSFET's saturated current-voltage (I-V) response through JFET's semi-conductive channel region 231, 281 at step 611. Another determination depending upon system requirements (e.g., switching regulator) is whether or not to initiate JFET switch-mode operation at step 621. JFET switch mode operation at step 621 is initiated by connecting JFET control gate 225, 275 to an external circuit to deliver a gate voltage VG to JFET control gate 225, 275 to alter exemplary DGLDMOSFET's I-V response between JFET cut-off mode operation (e.g., FIG. 19 step 511) and JFET saturation mode operation at step 611 to effect a predetermined exemplary DGLDMOSFET's (I-V) response operable at a duty cycle to effect a predetermined I-V response at step 623. LDMOSFET switch mode operation at step 613 is initiated by connecting LDMOSFET control gate 219, 269 to an external circuit to deliver a gate voltage VG to LDMOSFET control gate 219, 269 to alter exemplary DGLDMOSFET's I-V response between LDMOSFET cut-off mode operation (e.g., FIG. 18B step 461) and LDMOSFET saturation mode operation (e.g., FIG. 18B step 469) to effect a predetermined exemplary DGLDMOSFET's (I-V) response operable at a duty cycle to effect a predetermined I-V response at step 615. Another determination depending upon system requirements (e.g., radiation detector) is whether or not to initiate enhanced radiation mode operation at step 617. Enhanced radiation mode operation at step 617 is initiated by connecting JFET control gate 225, 275 to an external circuit to deliver a gate voltage VG to JFET control gate 225, 275 to alter exemplary DGLDMOSFET's I-V response between JFET cut-off mode operation (e.g., FIG. 19 step 511) and saturation mode operation (e.g., step 611 or step 613) to effect a predetermined exemplary DGLDMOSFET's (I-V) response operable at a duty cycle to effect a predetermined I-V response at step 619.

Figure 22A:
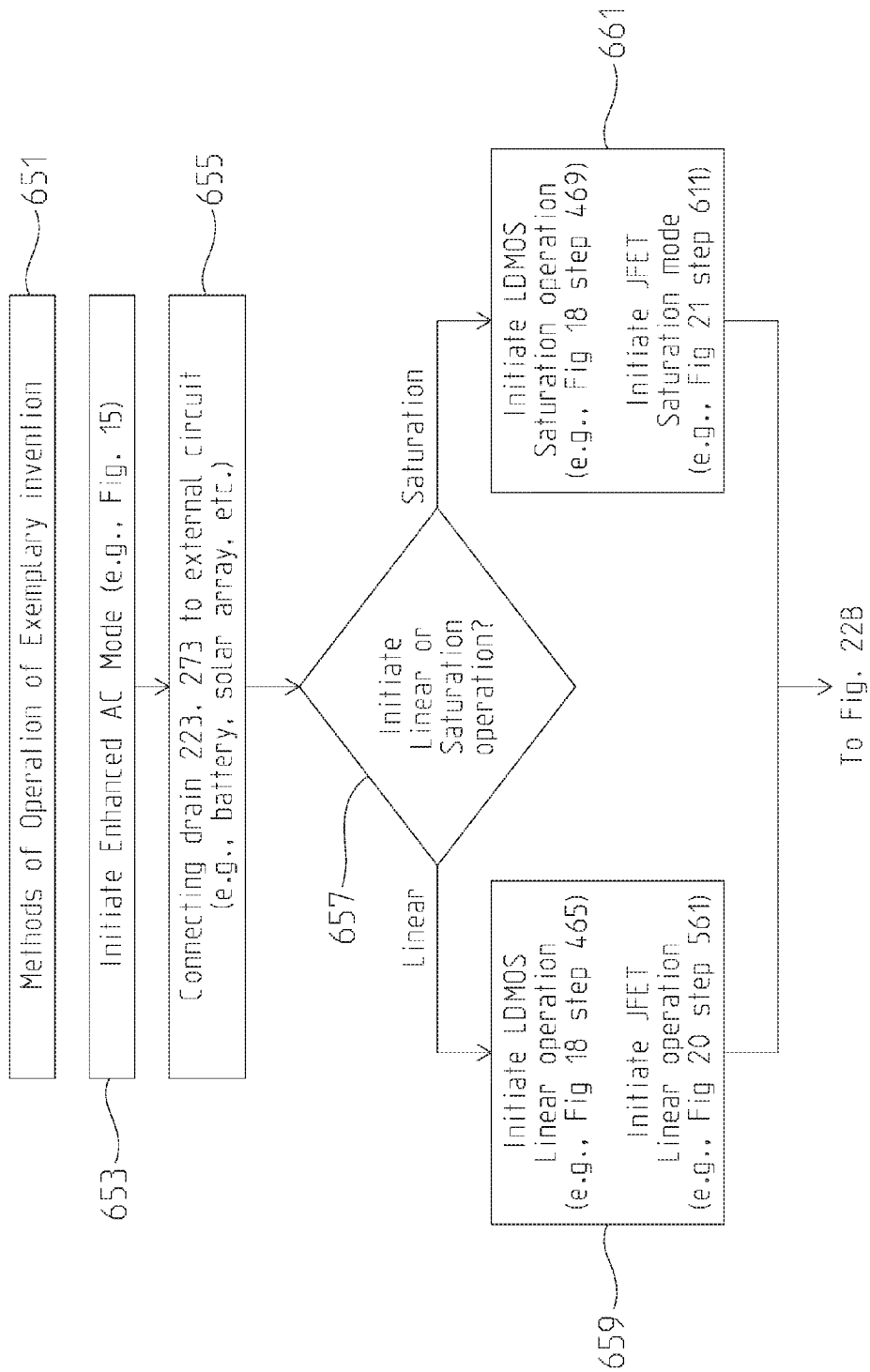
FIGS. 22A, 22B and 22C show an exemplary method of operation of an exemplary embodiment of the invention comprising another mode of operation.
Figure 22B:
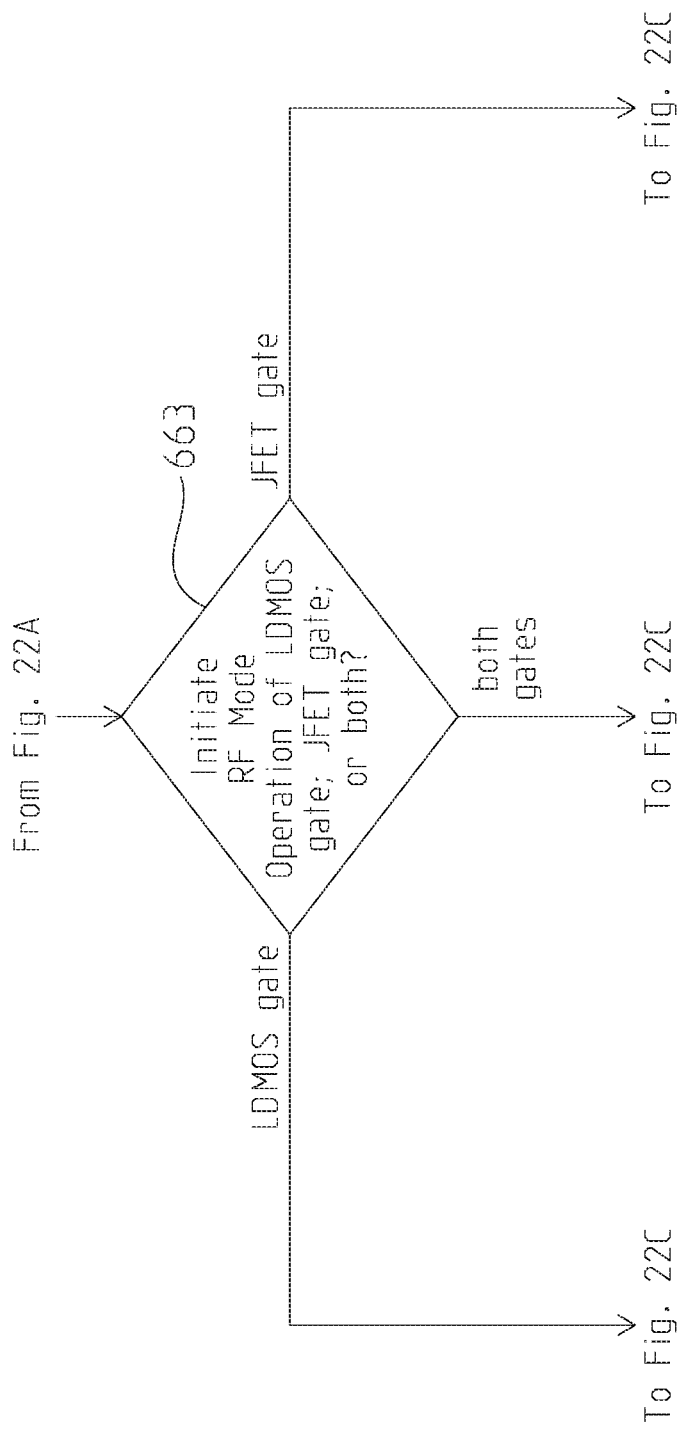
Figure 22C:
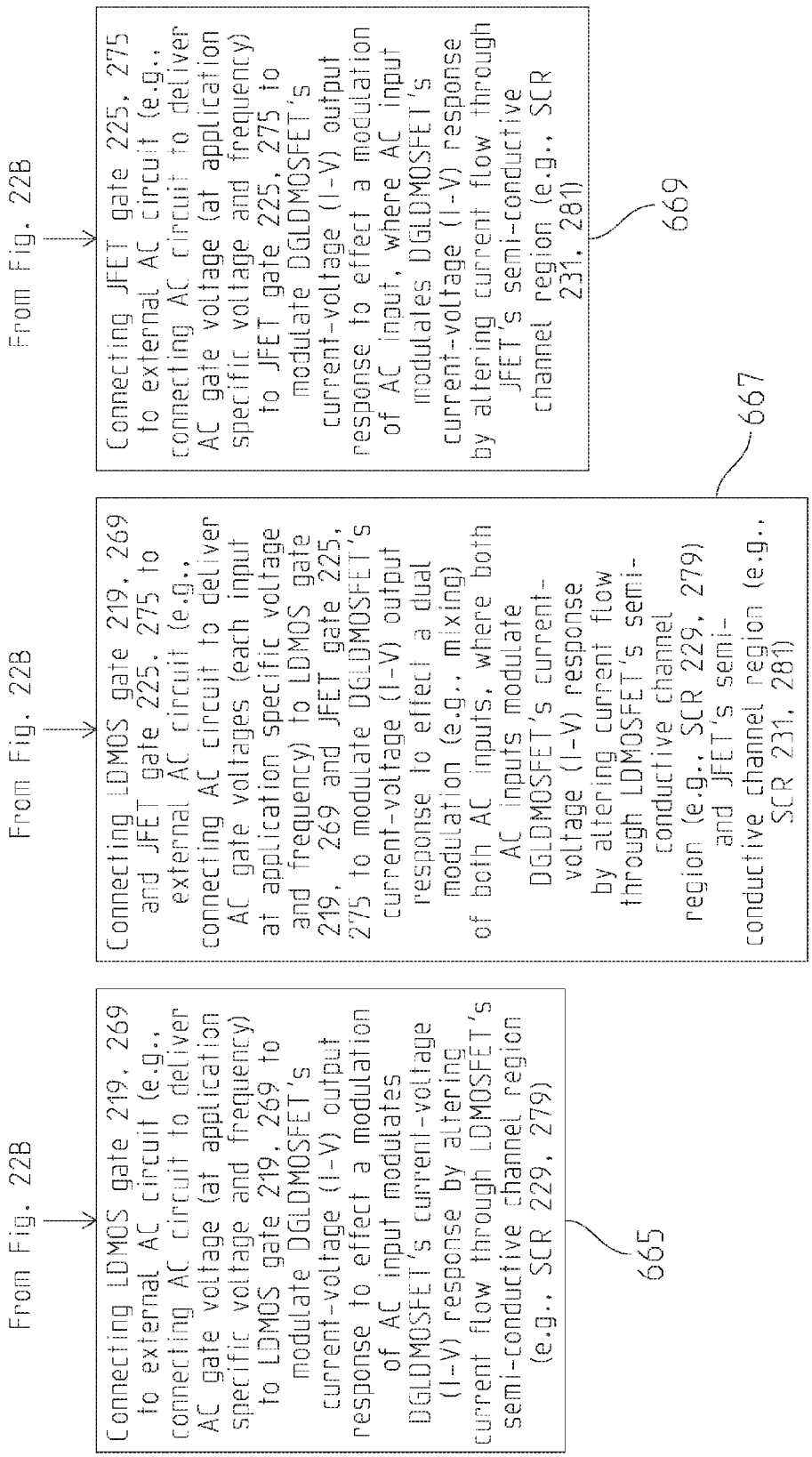

FIGS. 22A, 22B and 22C show another exemplary method of operation 651 in accordance with another embodiment of the invention. A process begins by initiating enhanced AC mode operation at step 653 by connecting the drain 223, 273 to an external circuit (e.g., power supply) at step 655. Another process determination at step 657 is initiating either LDMOSFET/JFET linear mode operation at step 659 (e.g., FIG. 18B step 465 and FIG. 20B step 561) or LDMOSFET/JFET saturation mode operation at step 661 (e.g., FIG. 18B step 469 and FIG. 21B step 611). Another process determination is initiating RF mode operation at step 663 of LDMOSFET control gate, JFET control gate, or both control gates. RF mode operation of LDMOSFET control gate at step 665 is initiated by connecting LDMOSFET control gate 219, 269 to an external AC circuit to deliver an AC voltage to LDMOSFET control gate 219, 269 to modulate exemplary DGLDMOSFET's I-V response to effect an AC modulation of exemplary DGLDMOSFET's output response. RF mode operation of gate step 669 is initiated by connecting JFET control gate 225, 275 to an external AC circuit to deliver an AC voltage to JFET control gate 225, 275 to modulate exemplary DGLDMOSFET's I-V response to effect an AC modulation of exemplary DGLDMOSFET's output response. RF mode operation of both LDMOSFET control gate and JFET control gate at step 667 is initiated by connecting LDMOSFET control gate 219, 269 and JFET control gate 225, 275 to external AC circuits to deliver AC voltages (in phase or out of phase) to each gate to AC modulate exemplary DGLDMOSFET output response.

Figure 23:
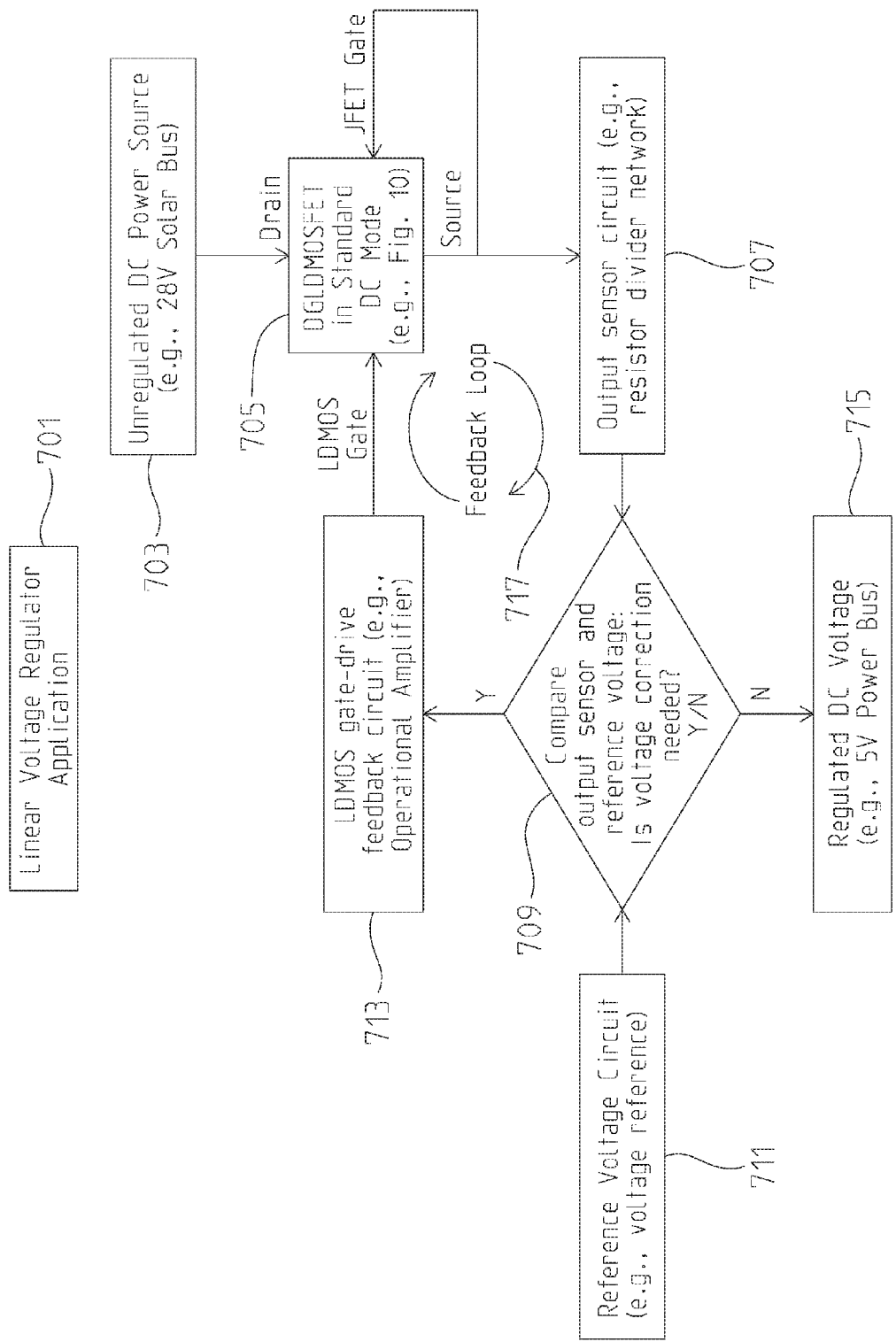
FIG. 23 shows an exemplary system type application (linear voltage regulator) of an exemplary DGLDMOSFET in accordance with one embodiment of the invention.

FIG. 23 shows a block diagram of an exemplary application (a linear voltage regulator 701) where an exemplary DGLDMOSFET 705 is connected to an unregulated DC power source 703 (e.g., 28 volt solar bus). The exemplary JFET control gate 225, 275 is connected to a source 221, 271. Source 221, 271 is connected to an output sensing circuit 707 (e.g., a resistor divider network). Sensing network 707 provides an input to an external comparator 709 with a reference voltage input 711. If regulated DC output voltage 715 is lower or higher than required regulated output voltage, feedback amplifier 713 provides corrective signal to adjust LDMOSFET control gate voltage (feedback loop 717) until required system output voltage is achieved.

Figure 24:
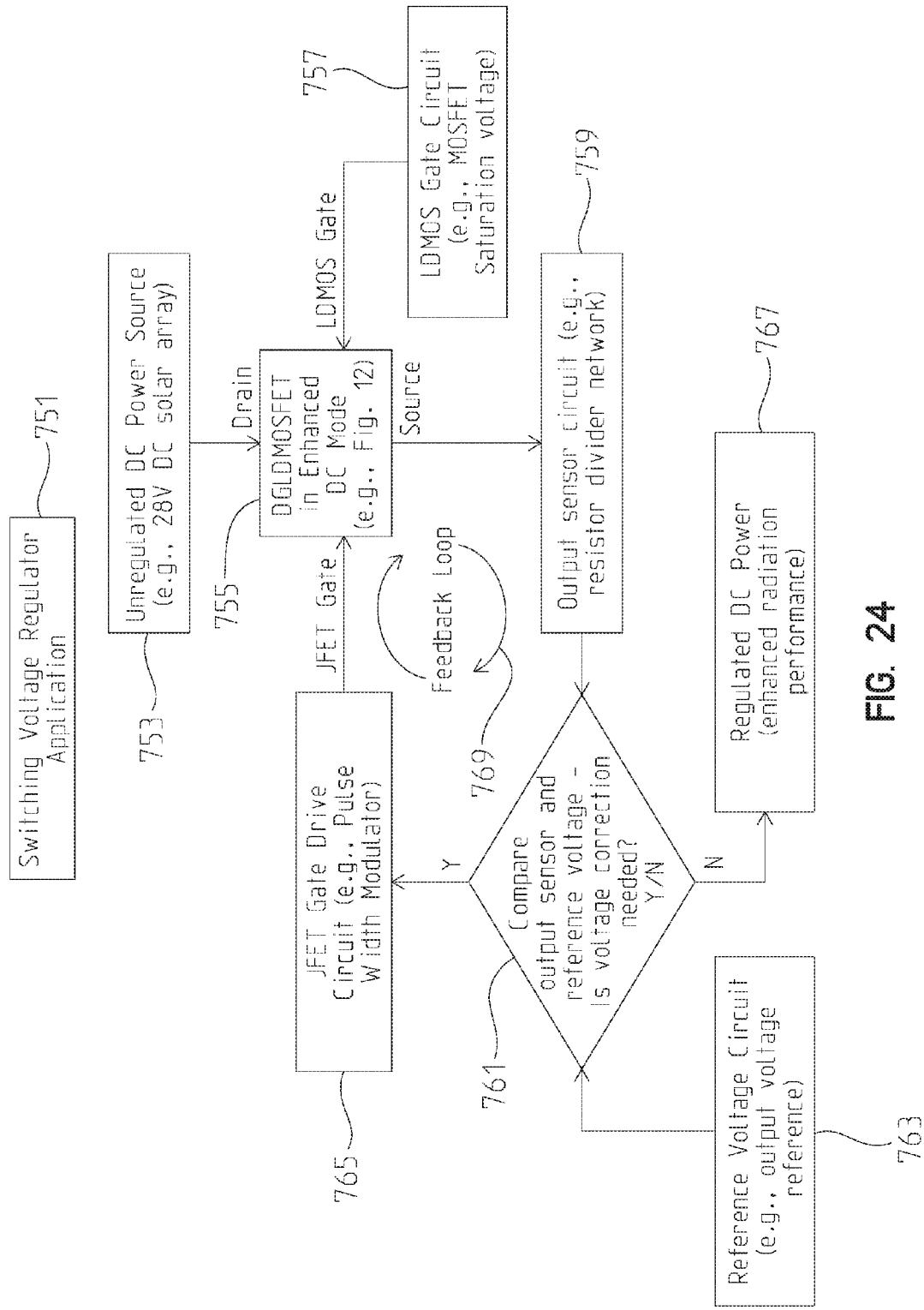
FIG. 24 shows an exemplary system type application (switching voltage regulator) of an exemplary DGLDMOSFET in accordance with one embodiment of the invention.

FIG. 24 shows a block diagram of an exemplary application (a switching voltage regulator 751) where an exemplary DGLDMOSFET 755 is connected to an unregulated DC power source 753 (e.g., 28 volt solar array). Exemplary LDMOSFET control gate 219, 269 is connected to a LDMOSFET control gate circuit 757 where LDMOSFET control gate 219, 269 is configured for saturation mode operation. Source 221, 271 is connected to an output sensing circuit 759 (e.g., a resistor divider network). Sensing network 759 provides an input to an error feedback amplifier 761 and another input form reference voltage circuit 763. If regulated DC output voltage 767 is lower or higher than regulated output voltage required by system, error feedback amplifier 761 adjusts JFET control gate drive circuit 765 (e.g., pulse width modulator) to determine system requirements and to alter duty cycle operating JFET control gate in switch-mode operation (feedback loop 769) until regulated output voltage required by system is achieved.

Figure 25:
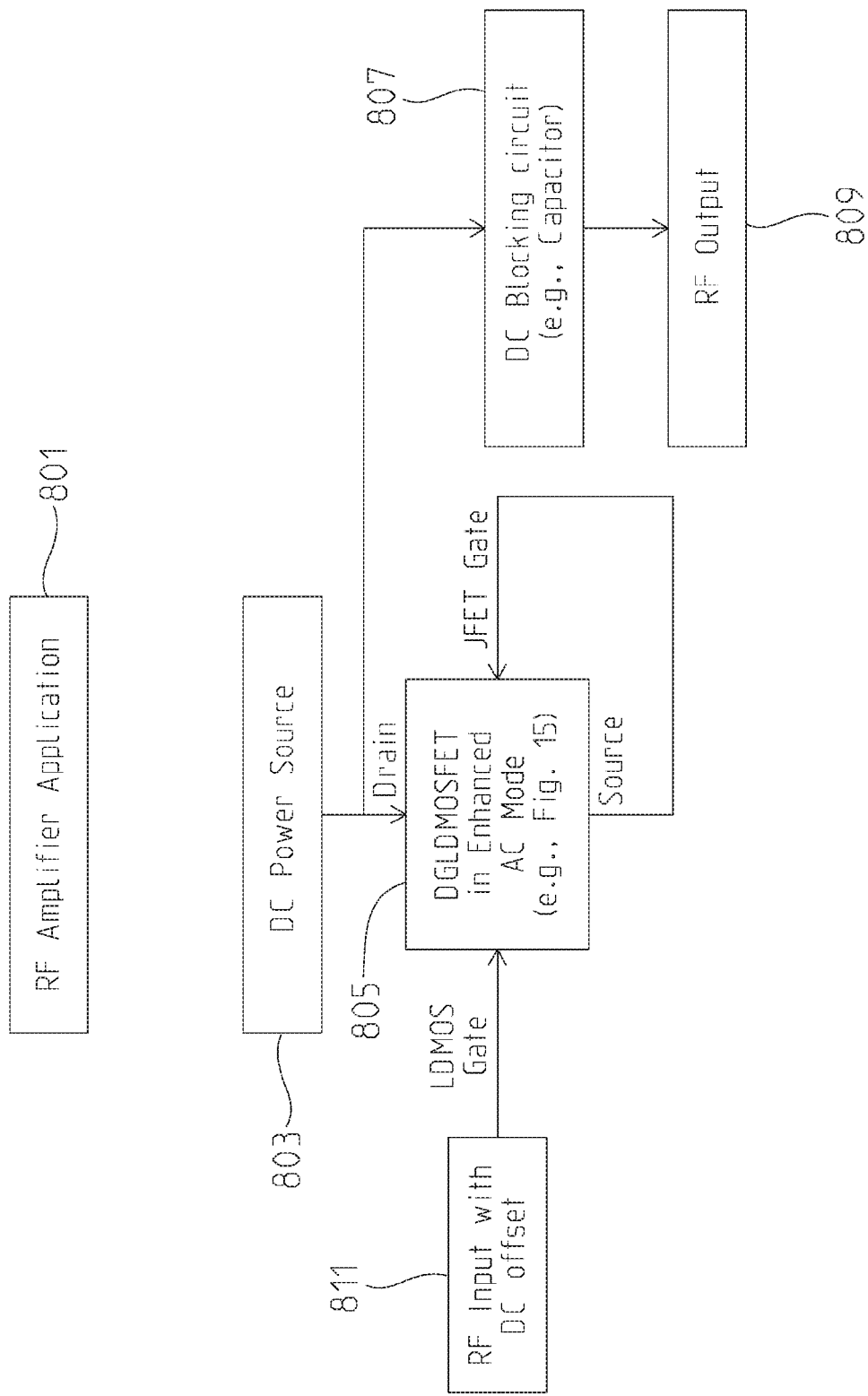
FIG. 25 shows an exemplary system type application (RF amplifier) of an exemplary DGLDMOSFET in accordance with one embodiment of the invention.

FIG. 25 shows a block diagram of an exemplary application (RF amplifier 801) where an exemplary DGLDMOSFET 805 is connected to DC power source 803 (e.g., regulated voltage source). Exemplary JFET control gate 225, 275 is connected to source 221, 271. Exemplary LDMOSFET control gate 219, 269 is connected to RF input with a DC offset circuit 811 where LDMOSFET control gate 219, 269 is configured in LDMOSFET linear operation and AC mode operation. Drain 223, 273 is connected to a DC blocking circuit 807 (e.g., capacitor), where DC blocking circuit 807 separates DC output voltage 803 and modulated RF output 809 signal delivering RF output to system.

Figure 26:
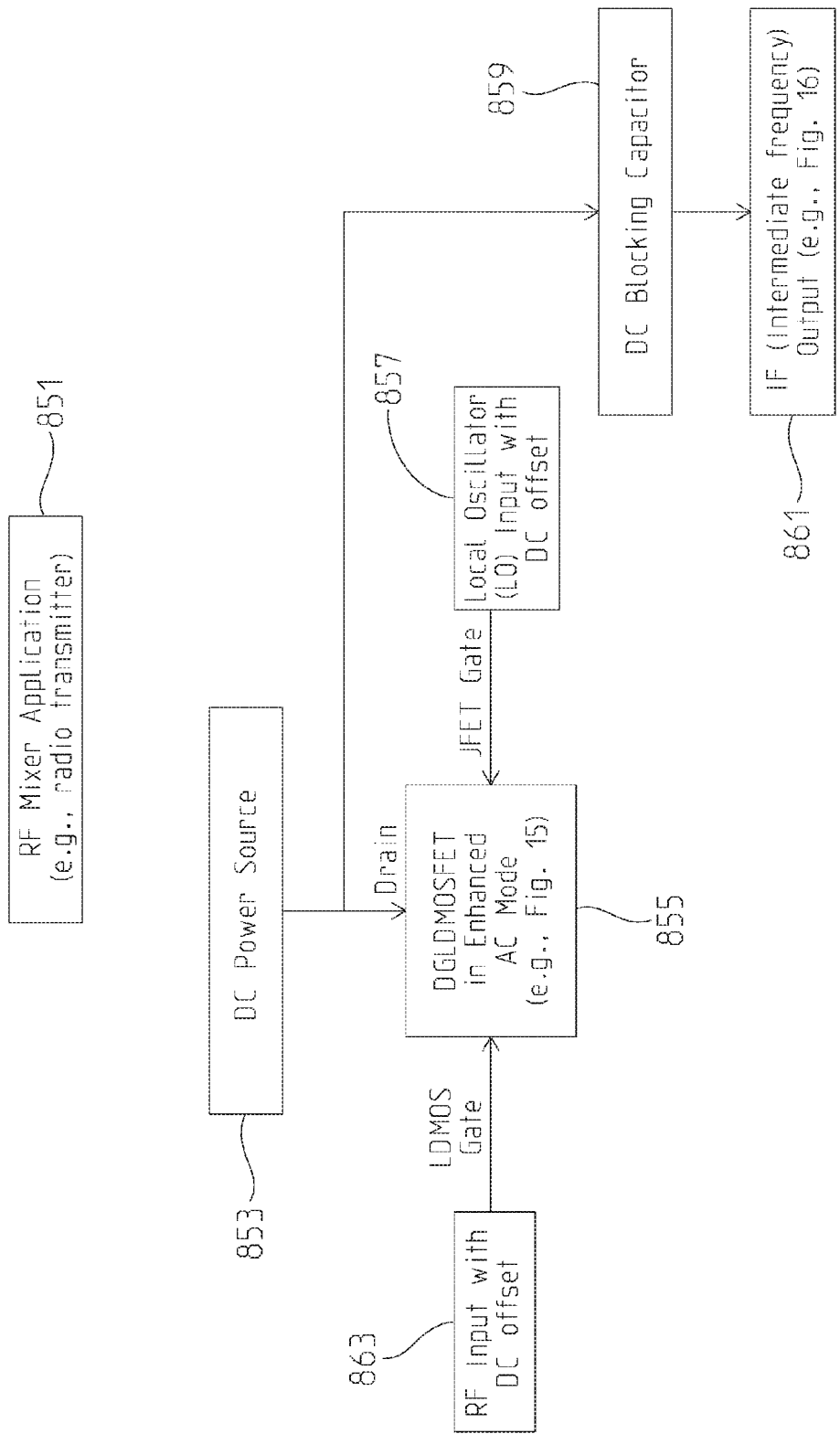
FIG. 26 shows an exemplary system type application (RF Mixer) of an exemplary DGLDMOSFET in accordance with one embodiment of the invention.

FIG. 26 shows a block diagram of an exemplary application (RF mixer 851) where an exemplary DGLDMOSFET 855 is connected to DC power source 853 (e.g., regulated voltage). Exemplary JFET control gate 225, 275 is connected to a local oscillator (LO) and DC offset circuit 857 and JFET control gate 225, 275 is configured for JFET linear mode operation and AC mode operation. Exemplary LDMOSFET control gate 219, 269 is connected to RF input and DC offset circuit 863 and LDMOSFET control gate 219, 269 is configured for LDMOSFET linear mode operation and AC mode operation. Drain 223, 273 is connected to DC blocking circuit 859 (e.g., DC blocking capacitor), where DC blocking circuit 859 separates DC output voltage 853 and modulated RF output 861 signal to deliver intermediate frequency (IF) to system.

Although the invention has been described in detail with reference to certain preferred embodiments, variations and modifications exist within the spirit and scope of the invention as described and defined in the following claims.

The invention claimed is:

1. An electrical system comprising:
    a lateral double-diffused metal-oxide-semiconductor field-effect transistor (LDMOSFET) section disposed in a substrate section, said LDMOSFET section comprising a LDMOSFET control gate, a source region, a drain region, and a LDMOSFET semi-conductive channel region (SCR) having a first, second, and third side in close proximity to a gate insulator region, wherein said first and second sides are on opposite sides and said third side is orthogonal to said first and second sides, wherein said first and second sides of LDMOSFET SCR are formed between said source region adjacent to said first side of LDMOSFET SCR and said drain region adjacent to said second side of LDMOSFET SCR, wherein said third side of LDMOSFET SCR is adjacent to said LDMOSFET control gate, said LDMOSFET control gate is also formed partially overlapping a section of said source region, said LDMOSFET control gate is also formed partially overlapping a section of said drain region, said LDMOSFET control gate is further disposed on said LDMOSFET third side SCR; and
    a junction field effect transistor (JFET) section disposed in said substrate section, said JFET section comprising a JFET control gate and a JFET SCR having a first and second side, wherein first and second side are opposing sides, where said first side of JFET SCR in close proximity to second side of said LDMOSFET SCR, where said second side of JFET SCR is in close proximity to said JFET control gate region, where said JFET control gate comprising an opposite dopant of said JFET SCR, said JFET control gate further formed comprising a doped region not in physical contact with said source region or said LDMOSFET control gate, positioned at a first distance from said LDMOSFET control gate, where said first distance determines a distance that an electromagnetic field generated by said JFET control gate must travel to traverse said JFET SCR, wherein said JFET control gate disposed within said drain region is positioned at said first distance to said LDMOSFET control gate.

2. An electrical system as in claim 1, further comprising a control system for controlling said JFET and said LDMOSFET sections in a or second operating mode, said first operating mode comprises operating said LDMOSFET or said JFET in a stand-alone configuration, said second operating mode comprises a combined operations mode, said control system comprising an automated system comprising a control section configured with control logic or instructions configured to operate said control section and at least one input sections configured for detecting a triggering condition for said second mode based on inputs from said input sections, said input sections comprising electromagnetic field sensors configured for detecting electromagnetic fields which interfere with said LDMOSFET operation.

3. An electrical system as in claim 2, wherein said electromagnetic sensors comprise one or more radiation sensors positioned in proximity to at least a section of said LDMOSFET.

4. An electrical system as in claim 2, wherein said control systems can comprise a radio frequency transmitter or receiver system.

5. An electrical system as in claim 1, further comprising a plurality of alternating current (AC) voltage sources each one coupled to said LDMOSFET section and said JFET section.

6. An electrical system as in claim 5, further comprising a second control system section operable to modulate said plurality of alternating-current (AC) voltage sources to generate a radio-frequency response output from said LDMOSFET and JFET sections.

7. An electrical system as in claim 1, further comprising a plurality of direct-current (DC) voltage sources that are each coupled to an input gate of said LDMOSFET and JFET sections.

8. An electrical system as in claim 1, further comprising a direct-current (DC) voltage source that is coupled to an input gate of said LDMOSFET section wherein an input gate of said JFET is coupled to a source for said LDMOSFET section coupled to a common drain for said LDMOSFET section.

9. An electrical system as in claim 1, wherein said third LDMOSFET SCR side is a top section of said SCR that is formed underneath said LDMOSFET control gate and said first and second LDMOSFET SCR sides are lateral opposing sides of said LDMOSFET SCR with respect to said first LDMOSFET SCR side.

10. An electrical system comprising:
a lateral double-diffused metal-oxide-semiconductor field-effect transistor (LDMOSFET) section configured to control a first portion of a first electrical path, said LDMOSFET section is formed with a LDMOSFET control gate, a LDMOSFET source region, a LDMOSFET drain region, and a LDMOSFET semi-conductive channel region (SCR) formed with a first SCR side, an opposing second SCR side and an orthogonal third SCR side, wherein said first SCR side adjacent to said source region, said second SCR side adjacent to said drain region, said third SCR side facing and in proximity with said LDMOSFET control gate, said LDMOSFET control gate controls a first electrical current passing through said first portion of said first electrical path comprising said LDMOSFET SCR; and
a junction-field-effect transistor (JFET) section configured to control a second portion of said first electrical path, said JFET section is formed with a JFET control gate and a a JFET SCR formed with a first SCR side, an opposing second SCR side, and an orthogonal third SCR side, wherein said JFET first SCR side adjacent to said LDMOSFET second SCR side, said JFET second SCR side adjacent to JFET control gate, and said JFET third SCR side adjacent to LDMOSFET control gate, wherein said JFET control gate is positioned at a first distance from said LDMOSFET second SCR side, where said first distance is determined by said JFET control gate generating an electromagnetic field to traverse from said JFET second SCR side to said JFET first SCR side, said JFET section controls a second electrical current passing through said second portion of said first electrical path comprising said JFET SCR;
wherein operation of said LDMOSFET control gate modulates or controls said first electrical current passing through said LDMOSFET SCR and operation of said JFET control gate modulating or controlling said second electrical current passing through said JFET SCR.

11. An electrical system as in claim 10, further comprising a control system for determining when said JFET and said LDMOSFET are operated independently or together to modulate said first and second SCR regions in coordination with each other to modulate said first and second electrical currents passing through said first electrical path, wherein said control system further comprises an automated system including at least one electromagnetic field sensors as well as a control section, wherein said at least one electromagnetic field sensors comprises one or more radiation sensors, said control section operates said JFET to control said second SCR to alter said first electrical current flowing through said first SCR when said at least one electromagnetic field sensors detect an external electromagnetic field external to said electrical system that interferes with said LDMOSFET's operation.

12. An electrical system as in claim 1, wherein said electrical system can further comprise a radio-frequency transmitter or receiver system formed with combined said LDMOSFET section and said JFET section.

13. An electrical system as in claim 12, further comprising a plurality of alternating-current (AC) voltage sources each one coupled to said LDMOSFET section and said JFET section.

14. An electrical system as in claim 13, further comprising a control system operable to modulate said plurality of alternating-current (AC) voltage sources to generate a radio-frequency response output from said LDMOSFET and JFET sections.

15. An electrical system as in claim 10, further comprising a plurality of direct-current (DC) voltage sources that are each coupled to an input gate of said LDMOSFET section and said JFET section.

16. An electrical system as in claim 10, further comprising a direct-current (DC) voltage source that is coupled to an input gate of said LDMOSFET section wherein an input gate of said JFET is coupled to a source for said LDMOSFET section coupled to a common drain for said LDMOSFET section.

17. A method associated with an electrical system comprising:
providing an electrical system comprising a lateral double-diffused metal-oxide-semiconductor field-effect transistor (LDMOSFET) section configured to control a first portion of a first electrical path and a junction-field-effect transistor (JFET) section configured to control a second portion of said first electrical path;
wherein said LDMOSFET section is formed with a LDMOSFET control gate, a LDMOSFET source region, a LDMOSFET drain region, and a LDMOSFET semi-conductive channel region (SCR) formed with a first SCR side, an opposing second SCR side and an orthogonal third SCR side, wherein said first SCR side adjacent to said source region, said second SCR side adjacent to said drain region, said third SCR side facing and in proximity with said LDMOSFET control gate, said LDMOSFET control gate controls a first electrical current passing through said first portion of said first electrical path comprising said LDMOSFET SCR;
wherein said JFET section is formed with a JFET control gate and a JFET SCR formed with a first SCR side, an opposing second SCR side, and an orthogonal third SCR side, wherein said JFET first SCR side adjacent to said LDMOSFET second SCR side, said JFET second SCR side adjacent to JFET control gate, and said JFET third SCR side adjacent to LDMOSFET control gate, wherein said JFET control gate is positioned at a first distance from said LDMOSFET second SCR side, where said first distance is determined by said JFET control gate generating an electromagnetic field to traverse from said JFET second SCR side to said JFET first SCR side, said JFET section controls a second electrical current passing through said second portion of said first electrical path comprising said JFET SCR;

wherein operation of said LDMOSFET control gate modulates or controls said first electrical current passing through said LDMOSFET SCR and operation of said JFET control gate modulating or controlling said second electrical current passing through said JFET SCR.

18. A method as in claim 17, further comprising providing a control system configured for operating said electrical system, said operating comprises determining when said JFET and said LDMOSFET are operated independently or together to modulate said first and second SCR regions in coordination with each other to modulate said first and second electrical currents flowing through said first electrical path, wherein said control system further comprises an automated system including at least one electromagnetic field sensors as well as a control section, wherein said at least one electromagnetic field sensors comprises one or more radiation sensors, said control section operates said JFET to control said second SCR to alter said first electrical current flowing through said first SCR when said at least one said electromagnetic field sensors detect an external electromagnetic field external to said electrical system that interferes with said LDMOSFET's operation.

19. A method as in claim 18, further comprising operating said control system to adjust, modulate, or cut-off said first or second electrical current passing through said first or second SCRs based on input from said at least one electromagnetic sensors.

20. A method as in claim 19, wherein said operating comprises a LDMOSFET cut-off mode to halt passage of said first electrical current through said LDMOSFET SCR section.

21. A method as in claim 19, wherein said operating comprises a LDMOSFET linear mode to alter resistive characteristics of at least a portion of said LDMOSFET section.

22. A method as in claim 19, wherein said operating comprises a LDMOSFET saturation mode to limit an amount of current that can pass through at least a portion of said LDMOSFET section.

23. A method as in claim 17, wherein said electrical system further comprises a radio-frequency transmitter or receiver system comprising said LDMOSFET and said JFET sections.

24. A method as in claim 17, further comprising providing a plurality of alternating-current (AC) voltage sources each one coupled to said LDMOSFET section and said JFET section.

25. A method as in claim 17, further comprising providing a control system operable to modulate said plurality of alternating-current (AC) voltage sources to generate a radio-frequency response output from said LDMOSFET sections and JFET.

26. A method as in claim 17, further comprising providing a plurality of direct-current (DC) voltage sources that are each coupled to an input gate of said LDMOSFET section and said JFET section.

27. An electrical system as in claim 17, further comprising a direct-current (DC) voltage source coupled to an input gate of said LDMOSFET section wherein an input gate of said JFET is coupled to a source for said LDMOSFET section coupled to a common drain for said LDMOSFET section.

28. A method as in claim 18, further comprising:
operating said control section to detect a source of radiation or electromagnetic interference operable to affect operation of said LDMOSFET section using said at least one electromagnetic sensors; and
operating said control section to operate said JFET section in response to said detection of said source of radiation or electromagnetic radiation to control passage of said first or second electrical currents through said LDMOSFET section to alter said LDMOSFET's response to said source of radiation.

29. A method as in claim 18, wherein said operating further comprises operating said control section in a JFET cut-off mode to halt passage of said electrical signals through said LDMOSFET section.

30. A method as in claim 18, wherein said operating further comprises operating control section in a JFET linear mode to alter resistive characteristics of at least a portion of said LDMOSFET section.

31. A method as in claim 18, wherein said operating further comprises operating said control section in a JFET saturation mode to limit an amount of said first electrical current that can pass through at least a portion of said LDMOSFET section.

* * * * *